United States Patent
Lu et al.

(10) Patent No.: US 10,482,981 B2
(45) Date of Patent: Nov. 19, 2019

(54) PREVENTING REFRESH OF VOLTAGES OF DUMMY MEMORY CELLS TO REDUCE THRESHOLD VOLTAGE DOWNSHIFT FOR SELECT GATE TRANSISTORS

(71) Applicant: SanDisk Technologies LLC, Plano, TX (US)

(72) Inventors: Ching-Huang Lu, Fremont, CA (US); Vinh Diep, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/900,093

(22) Filed: Feb. 20, 2018

(65) Prior Publication Data
US 2019/0259462 A1    Aug. 22, 2019

(51) Int. Cl.
| | |
|---|---|
| G11C 16/04 | (2006.01) |
| G11C 16/34 | (2006.01) |
| G11C 16/30 | (2006.01) |
| G11C 16/26 | (2006.01) |
| G11C 16/32 | (2006.01) |
| G11C 16/08 | (2006.01) |
| G11C 11/56 | (2006.01) |
| G11C 16/24 | (2006.01) |
| G11C 16/10 | (2006.01) |

(52) U.S. Cl.
CPC ...... *G11C 16/3427* (2013.01); *G11C 16/0483* (2013.01); *G11C 16/08* (2013.01); *G11C 16/26* (2013.01); *G11C 16/30* (2013.01); *G11C 16/32* (2013.01); *G11C 16/3495* (2013.01); *G11C 11/5628* (2013.01); *G11C 11/5642* (2013.01); *G11C 11/5671* (2013.01); *G11C 16/10* (2013.01); *G11C 16/24* (2013.01); *G11C 16/3459* (2013.01)

(58) Field of Classification Search
CPC .. G11C 16/3427; G11C 16/0483; G11C 16/08
USPC ..... 365/185.02, 222, 230.03, 185.24, 185.23
See application file for complete search history.

(56) References Cited

U.S. PATENT DOCUMENTS 5,652,729 A * 7/1997 Iwata ................... G11C 11/406
365/149
9,286,994 B1 * 3/2016 Chen ..................... G11C 16/08
(Continued)

OTHER PUBLICATIONS

U.S. Appl. No. 15/451,186, filed Mar. 6, 2017, by Dutta et al.
U.S. Appl. No. 15/440,185, filed Feb. 23, 2017, by Alrod et al.
U.S. Appl. No. 15/333,440, filed Oct. 25, 2016, by Alrod et al.

*Primary Examiner* — Connie C Yoha
(74) *Attorney, Agent, or Firm* — Vierra Magen Marcus LLP

(57) ABSTRACT

Apparatuses and techniques are described for reducing charge loss in a select gate transistor in a memory device. In one aspect, a refresh operation is performed repeatedly to couple up data word line voltages but not dummy word line voltages. The refresh operation can involve applying a voltage pulse to the data word lines of a block when the block is not being used for a storage operation such as a program, read or erase operation. When the voltage pulse is applied to the data word lines, the dummy word lines can be set to a low level such as 0 V. This low level prevents or limits coupling up of the dummy memory cells to avoid creating an electric field which can cause holes to move from the dummy memory cells to adjacent select gate transistors.

22 Claims, 21 Drawing Sheets

(56) References Cited

U.S. PATENT DOCUMENTS

| | | | |
|---|---|---|---|
| 9,583,198 B1* | 2/2017 | Pang | G11C 16/10 |
| 2017/0301403 A1 | 10/2017 | Pang et al. | |
| 2017/0365349 A1 | 12/2017 | Pang et al. | |
| 2018/0114580 A1* | 4/2018 | Alrod | G11C 16/26 |

* cited by examiner

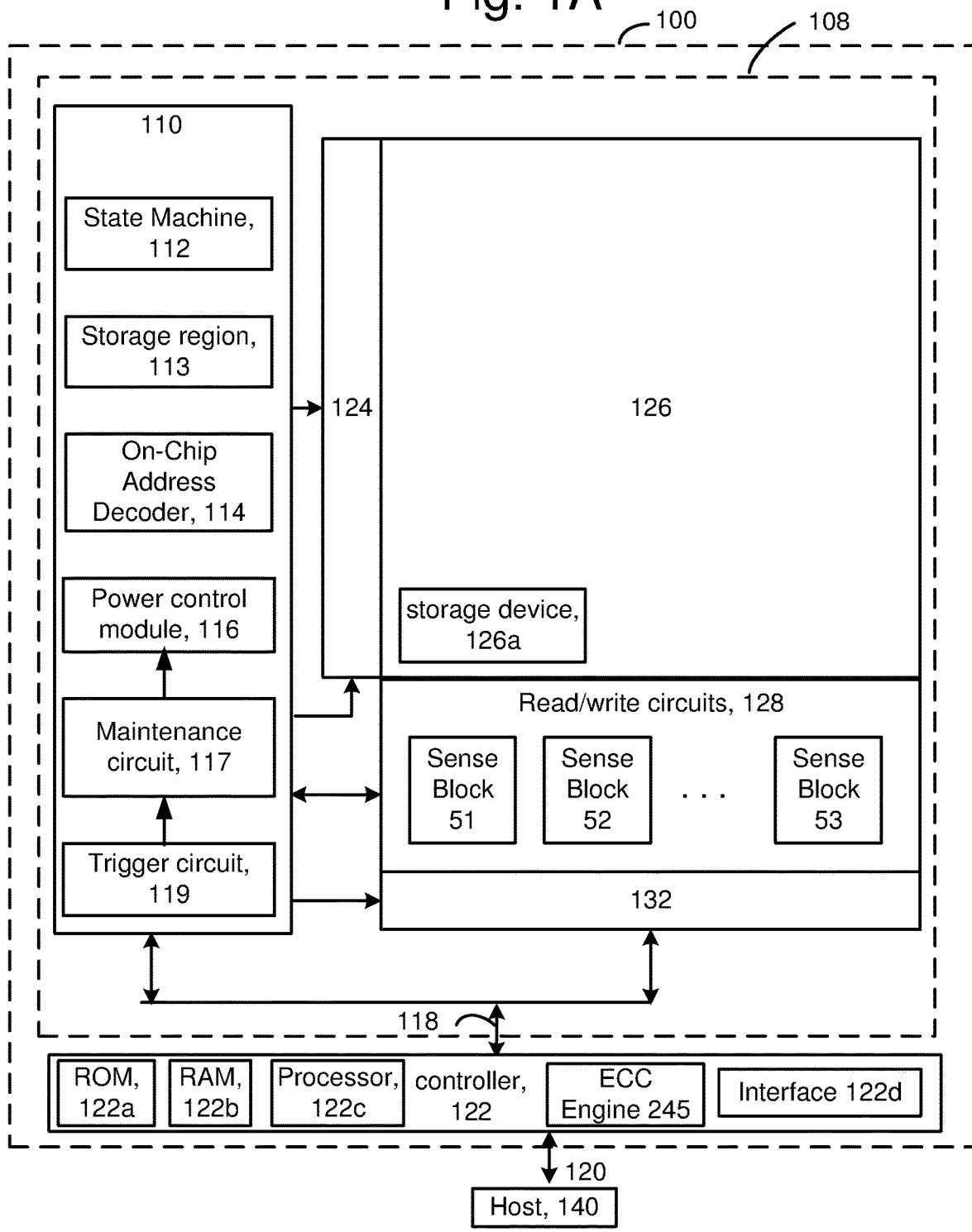

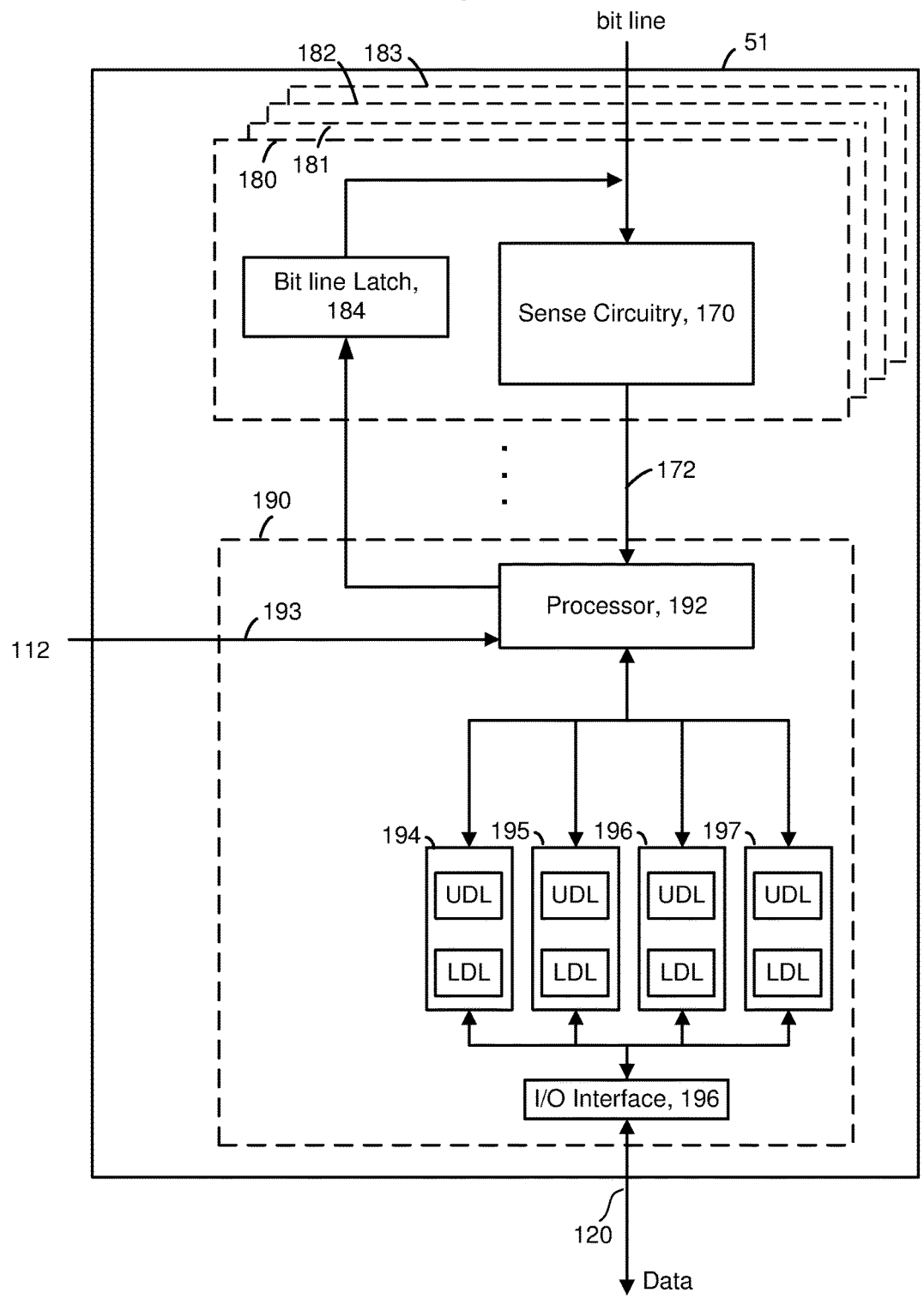

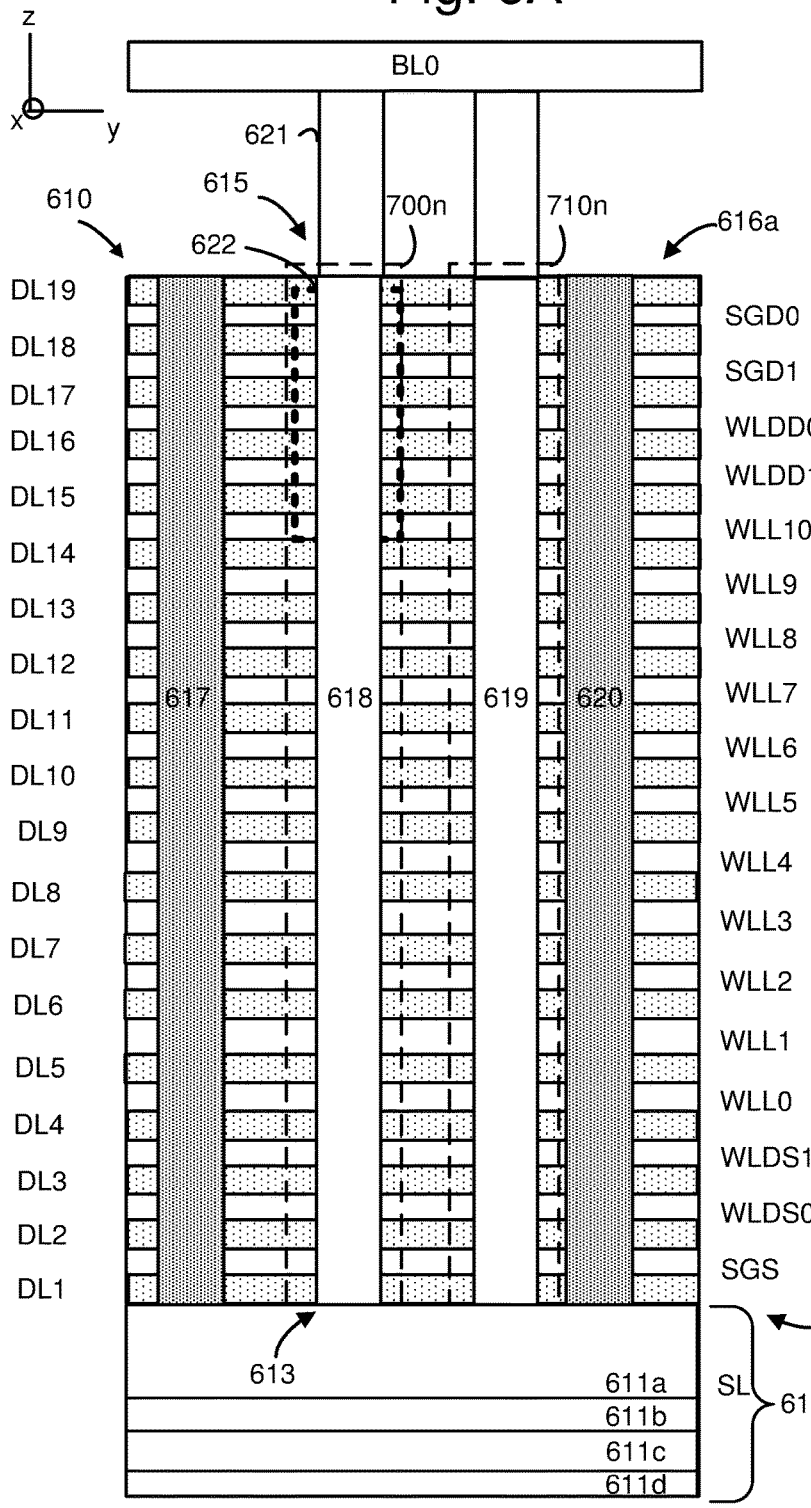
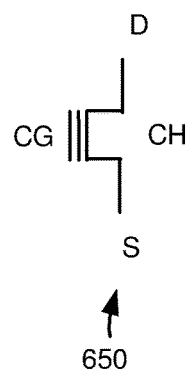
Fig. 6A
Fig. 6B

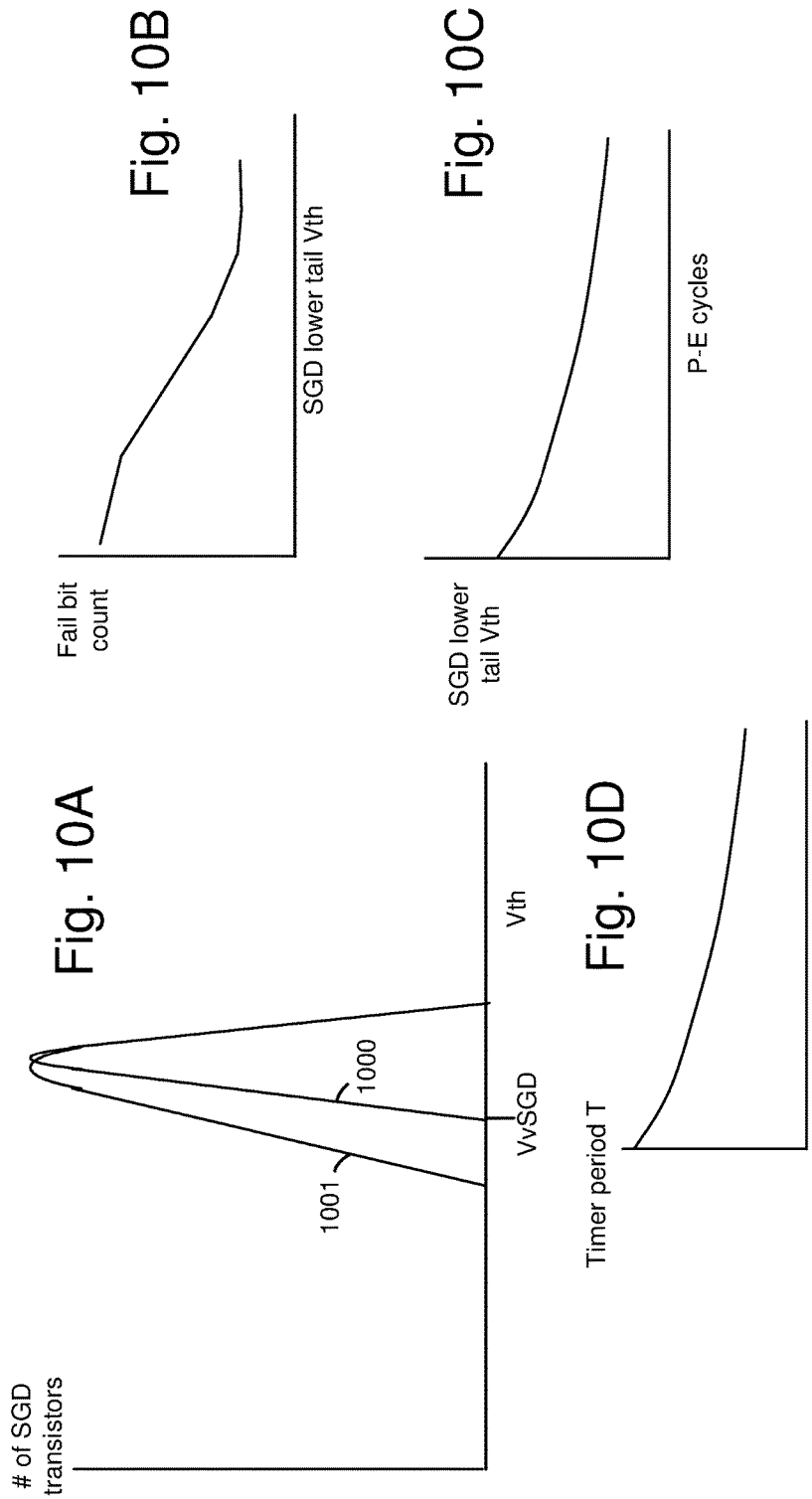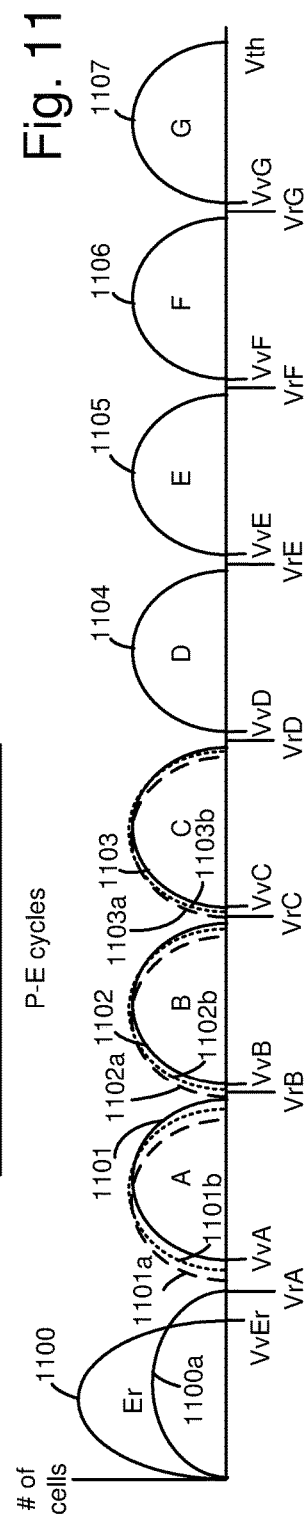

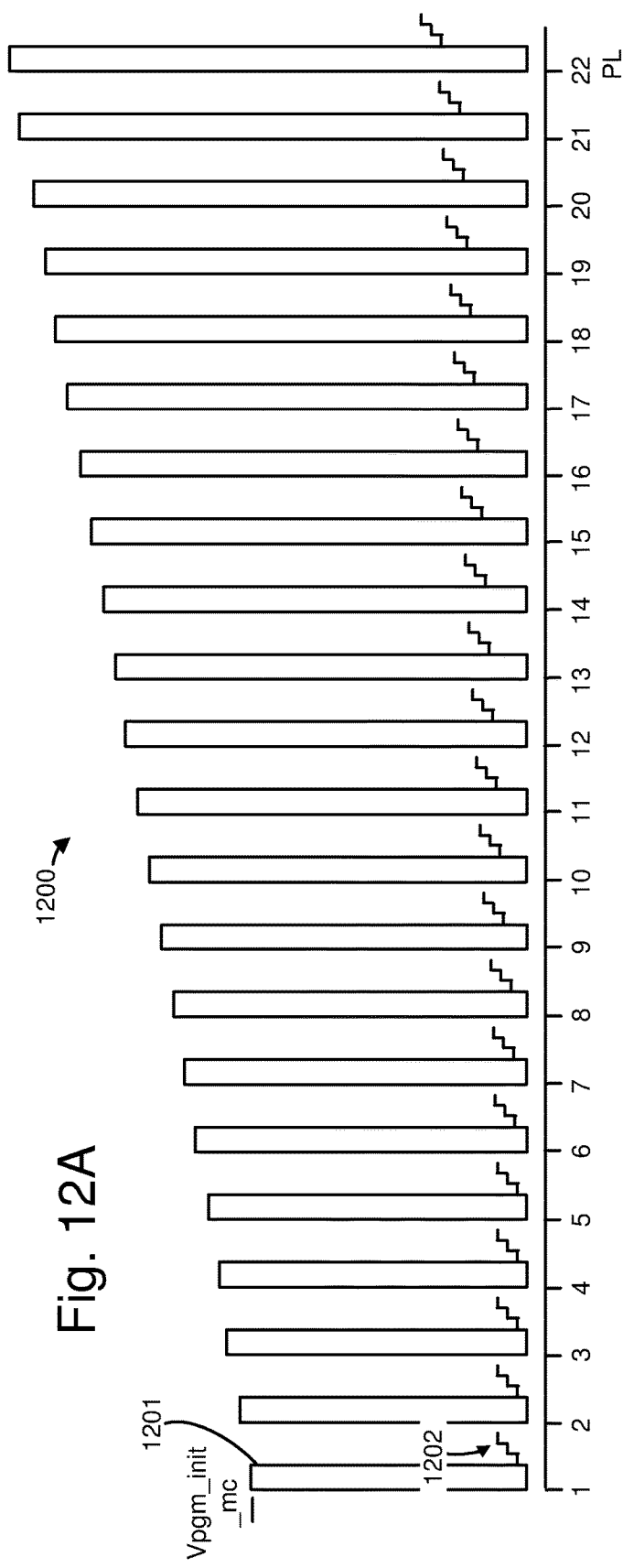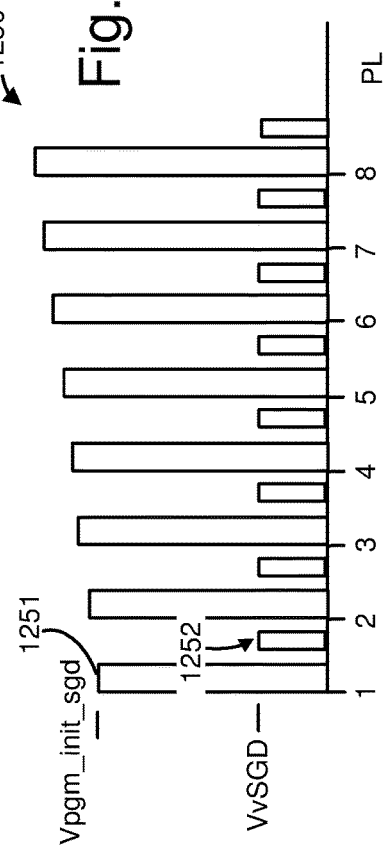

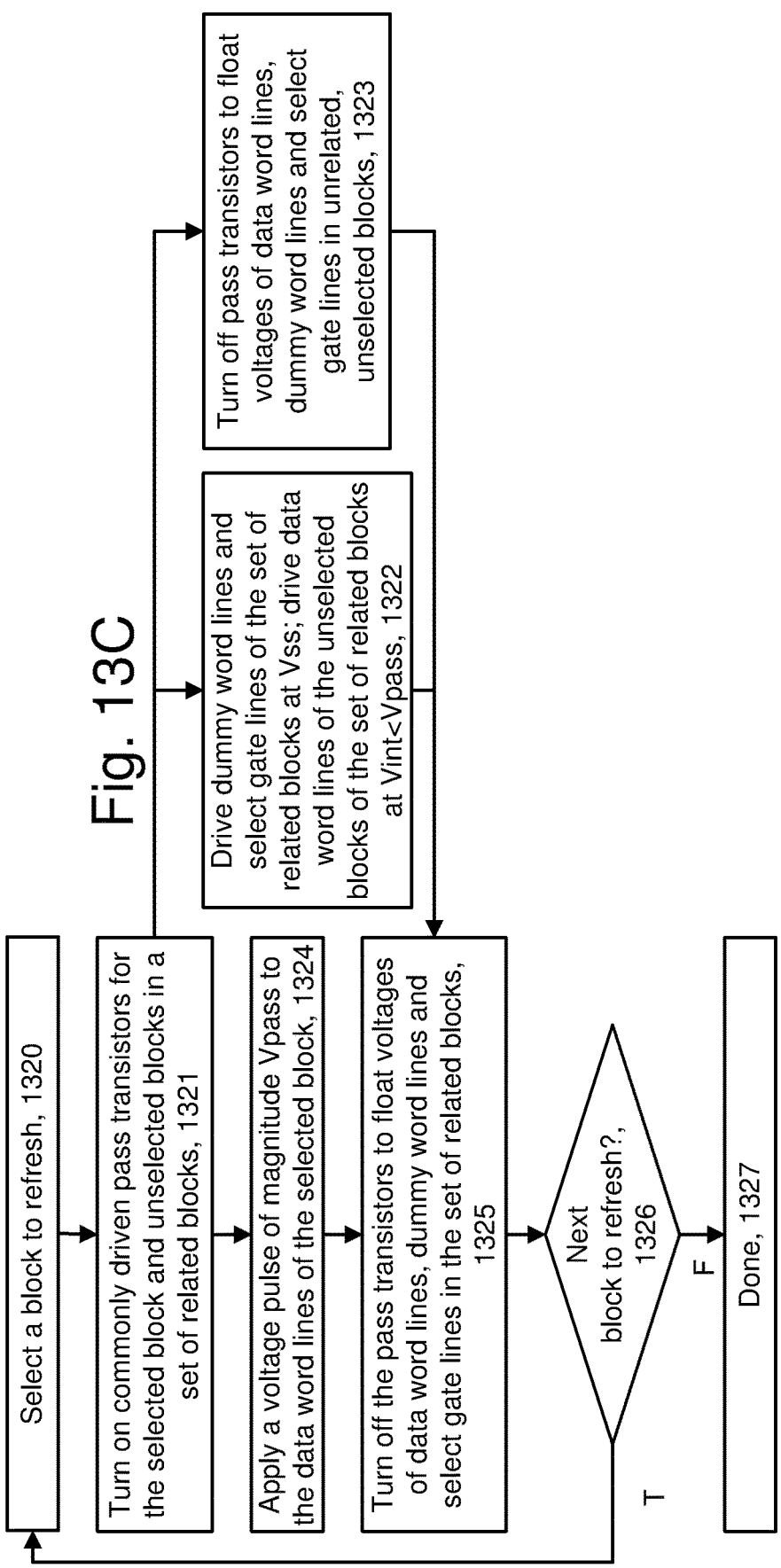

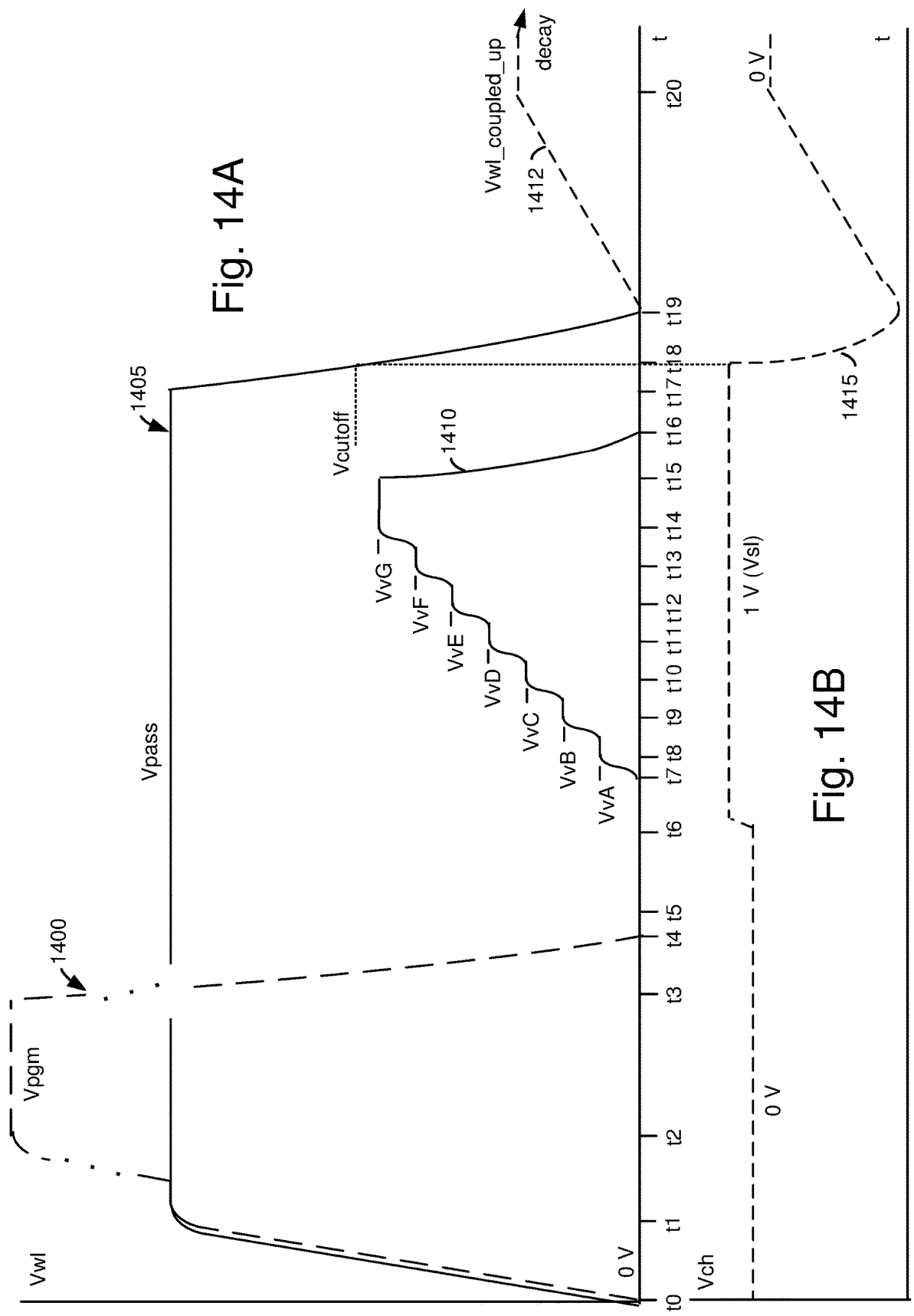

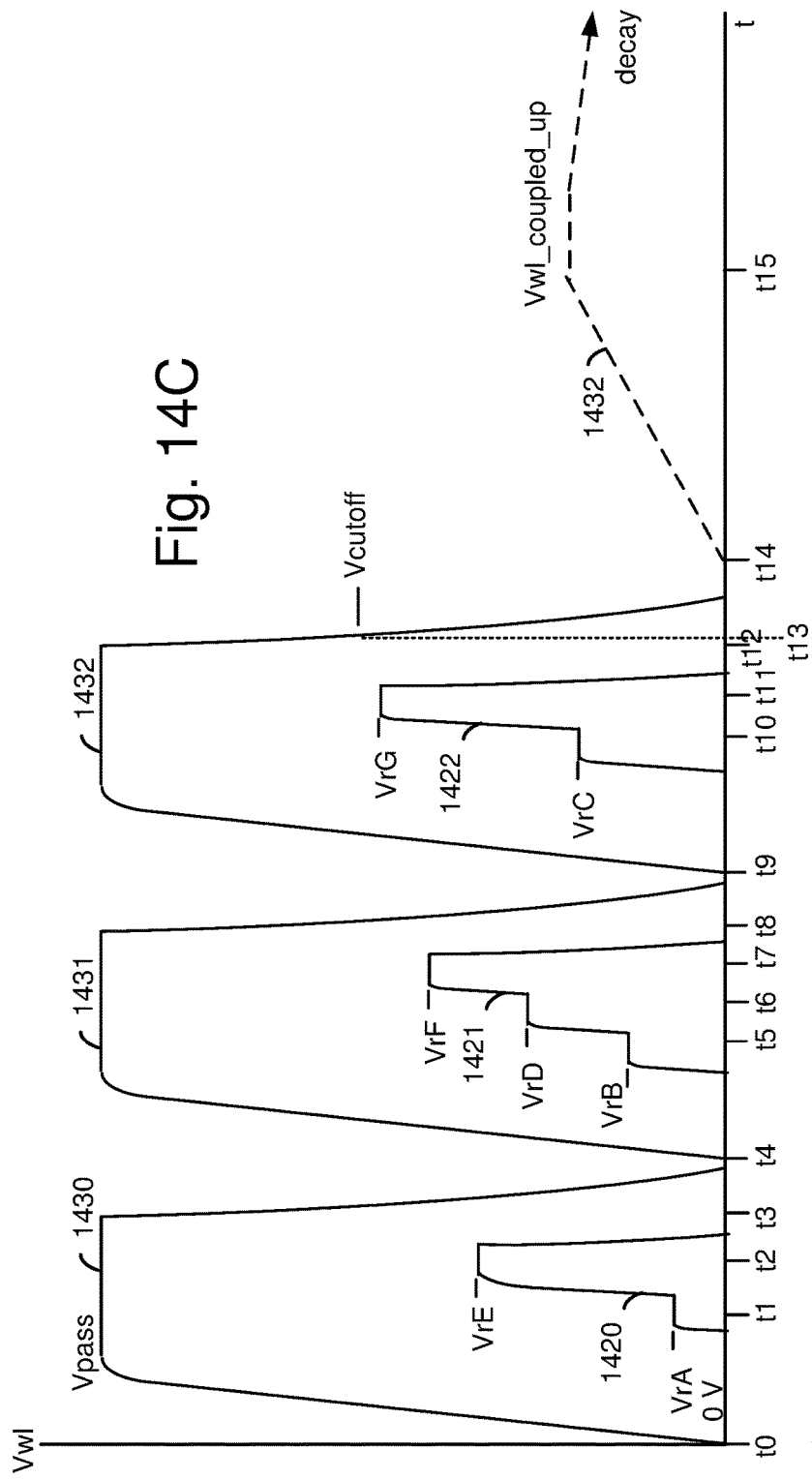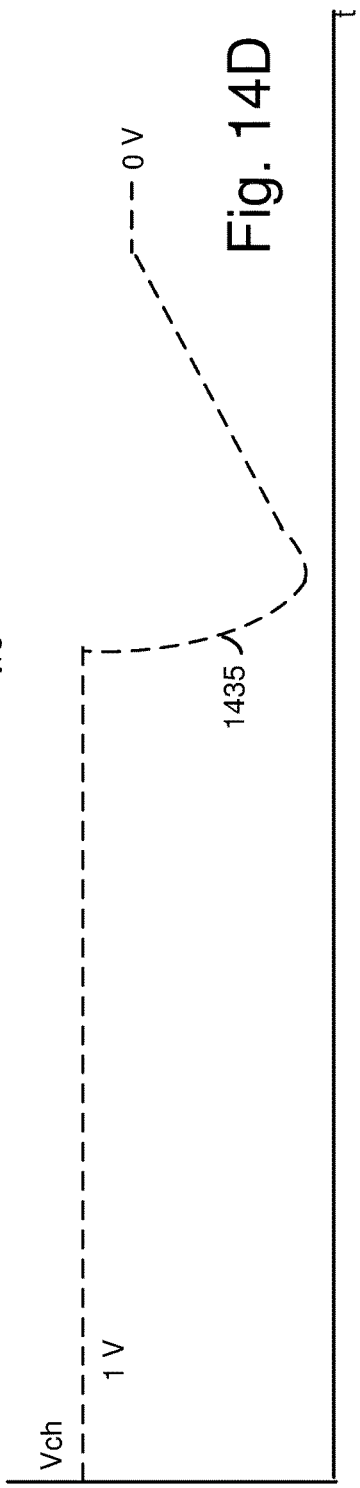

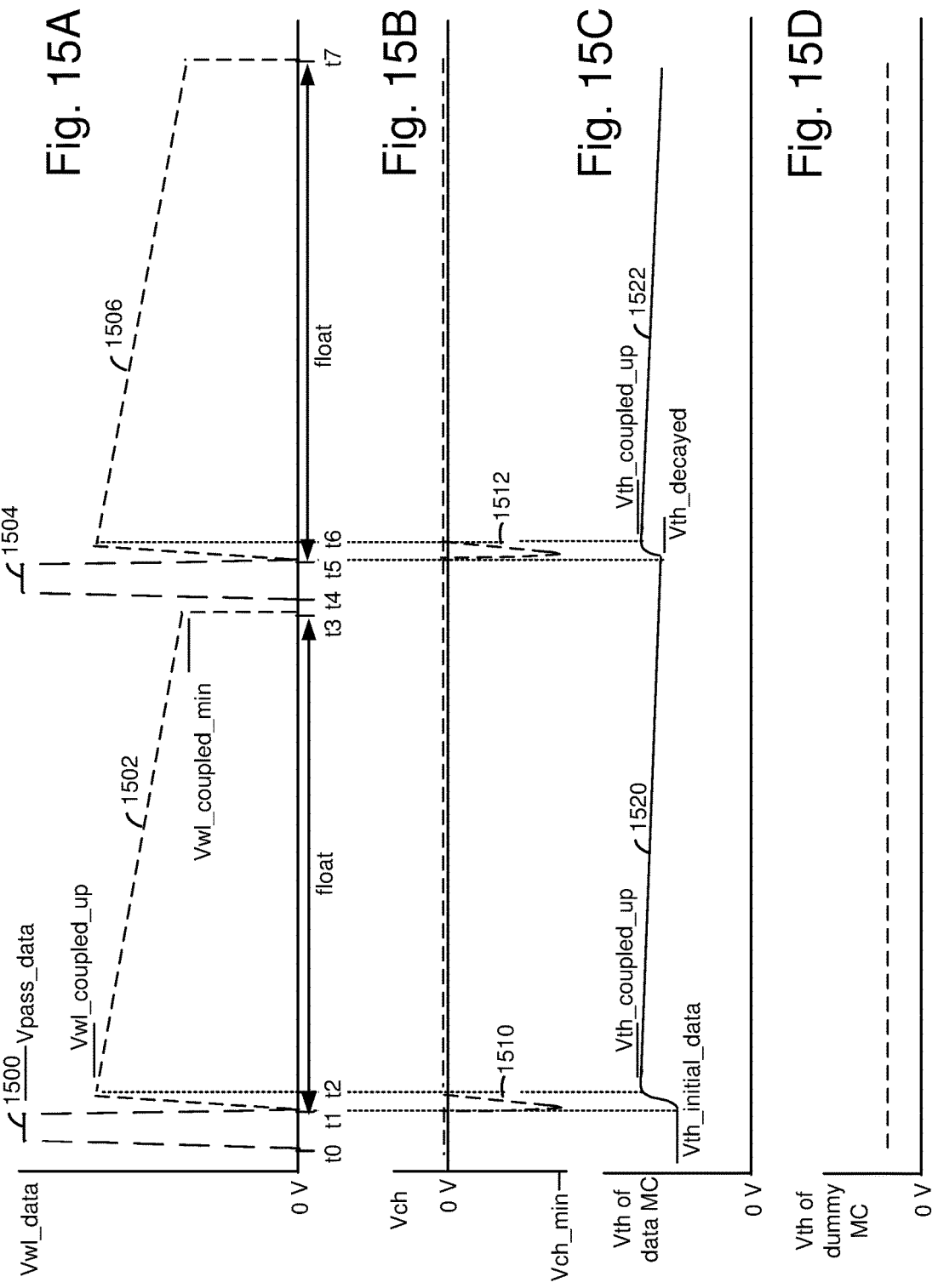

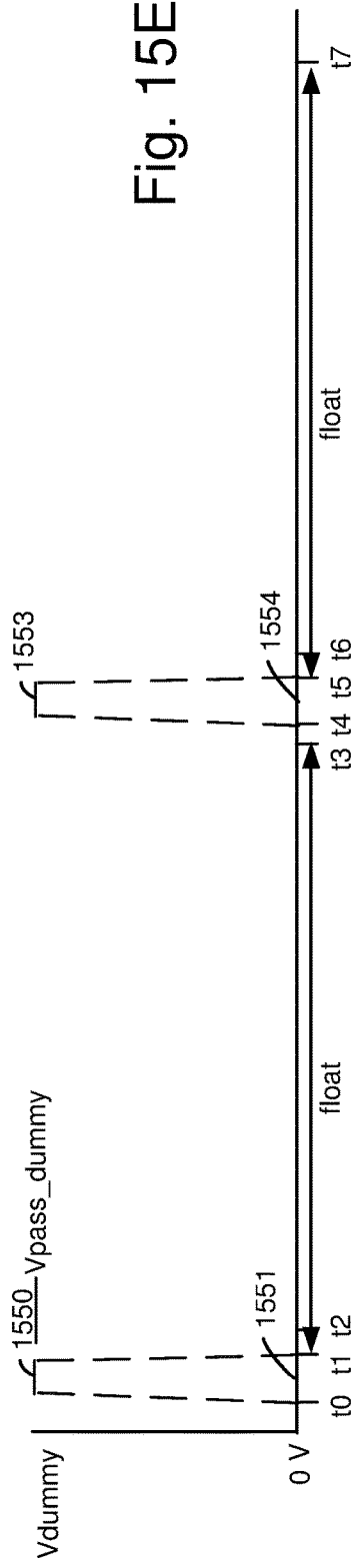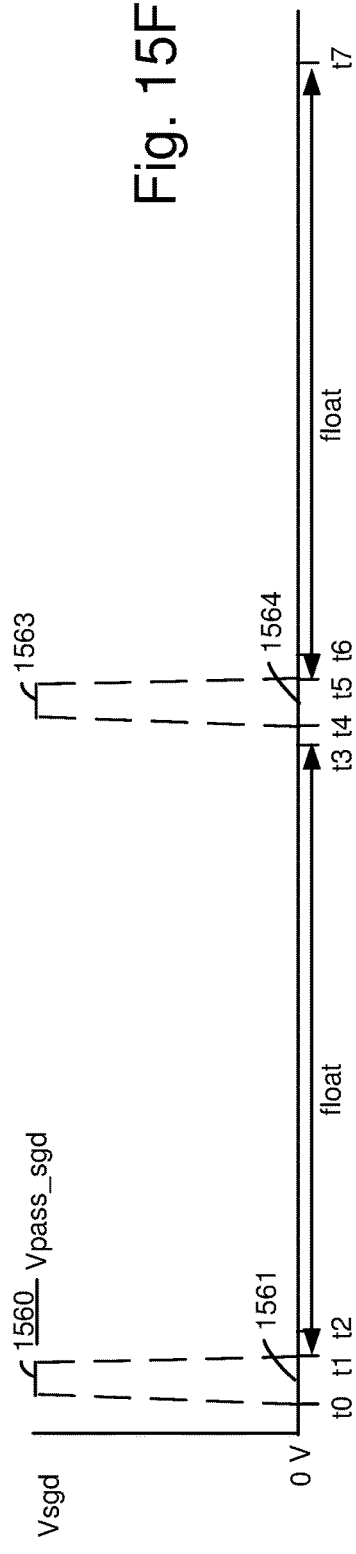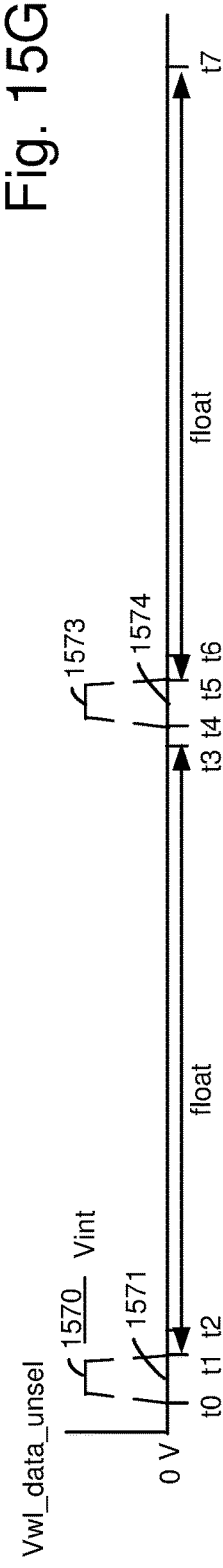

PREVENTING REFRESH OF VOLTAGES OF DUMMY MEMORY CELLS TO REDUCE THRESHOLD VOLTAGE DOWNSHIFT FOR SELECT GATE TRANSISTORS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND chains (e.g., NAND strings), for instance, where select gate transistors are provided at the ends of a NAND chain to selectively connect a channel of the NAND chain to a source line or bit line. However, various challenges are presented in operating such memory devices.

BRIEF DESCRIPTION OF THE DRAWINGS

FIG. 1A is a block diagram of an example memory device.

FIG. 2 is a block diagram depicting one embodiment of the sense block 51 of FIG. 1A.

FIG. 6A depicts an example cross-sectional view of a portion of the block BLK0 of FIG. 5.

FIG. 6B depicts an example transistor 650.

FIG. 10A depicts a threshold voltage distribution of select gate transistors for a fresh memory device (plot 1000) and for a cycled memory device (plot 1001) in which a Vth downshift occurs.

FIG. 10B depicts a plot of fail bit count versus the voltage of the lower tail of the Vth distribution of FIG. 10A, showing how the fail bit count increases as the Vth is downshifted.

FIG. 10C depicts a plot of an SGD lower tail Vth versus a number of program-erase cycles, showing how the Vth downshift becomes worse as the number of P-E cycles increases.

FIG. 10D depicts a plot of a time period T for performing a refresh operation versus a number of program-erase cycles.

FIG. 11 depicts an example Vth distribution of a set of memory cells, showing a Vth downshift due to a word line voltage decay consistent with FIG. 14A to 14D, and showing a reduced Vth downshift when a word line voltage refresh operation is used consistent with the process of FIG. 13A.

FIG. 12A depicts a voltage signal used in a series of program loops in an example program operation of a data memory cell which results in the Vth distributions 1100-1107 of FIG. 11.

FIG. 12B depicts a voltage signal used in a series of program loops in an example program operation of a select gate transistor which results in the Vth distribution (plot 1000) of FIG. 10A.

FIG. 13C depicts a process consistent with FIG. 13A, step 1301 for repeatedly refreshing data word line voltages without refreshing dummy word line voltages in related and unrelated blocks.

FIG. 14A depicts a plot of example waveforms in a programming operation, showing coupling up of a word line voltage, where the coupling up of a dummy word line voltage can cause the hole migration of FIG. 9B.

FIG. 14B depicts a plot of a channel voltage (Vch) corresponding to FIG. 14A.

FIG. 14C depicts a plot of example waveforms in a read operation, showing coupling up of a word line voltage, where the coupling up of a dummy word line voltage can cause the hole migration of FIG. 9B.

FIG. 14D depicts a plot of a channel voltage (Vch) corresponding to FIG. 14C.

FIG. 15A depicts a plot of data word line voltages in a process consistent with FIG. 13A for refreshing data word line voltages.

FIG. 15B depicts a plot showing a channel voltage associated with a data memory cell, consistent with FIG. 15A.

FIG. 15C depicts a plot of a Vth of a data memory cell, consistent with FIGS. 15A and 15B.

FIG. 15D depicts a plot of a Vth of a dummy memory cell, consistent with FIG. 15E, plots 1551 and 1554.

FIG. 15E depicts a plot of dummy word line voltages, including an option to prevent refreshing of the dummy word line voltages (plots 1551 and 1554), consistent with the process of FIG. 13A, and an option to refresh dummy word line voltages (plots 1550 and 1553), as a comparative example.

FIG. 15F depicts a plot showing select gate line voltages, including an option to provide select gate transistors in a non-conductive state (plots 1561 and 1564), consistent with the process of FIG. 13B, and an option to provide select gate transistors in a conductive state (plots 1560 and 1563).

FIG. 15G depicts a plot showing data word line voltages for an unselected block in a set of related blocks, consistent with the process of FIG. 13C and with the circuit of FIG. 4.

DETAILED DESCRIPTION

Figure 1B:
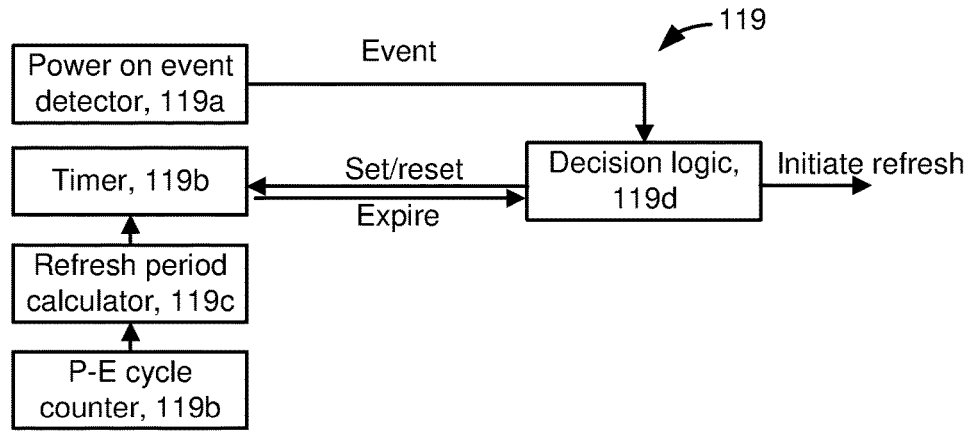
FIG. 1B depicts an example implementation of the trigger circuit 119 of FIG. 1A.

Apparatuses and techniques are described for reducing charge loss in a select gate transistor in a memory device.

In some memory devices, memory cells are joined to one another such as in NAND chains in a block or sub-block. Each NAND chain comprises a number of memory cells connected in series between one or more drain-end select gate transistors (referred to as SGD transistors), on a drain-end of the NAND chain which is connected to a bit line, and one or more source-end select gate transistors (referred to as SGS transistors), on a source-end of the NAND chain or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND chains in a stack, where the stack comprises alternating conductive and dielectric layers. The conductive layers act as word lines which are connected to the memory cells. Each NAND chain may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 14. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 11). In a four-bit per cell memory device, there are sixteen data states including the erased state and fifteen higher data states. The data states may be referred to as the S0-S15 data states where S0 is the erased state.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. During the read operation, the voltages of the unselected word lines are ramped up to a read pass level which is high enough to place the unselected memory cells in a strongly conductive state, to avoid interfering with the sensing of the selected memory cells.

To ensure proper program, erase and read operations in a NAND chain, the Vth of the SGD transistor should be in a specified range. However, it has been observed that the Vth can decrease over time, such as shown in FIG. 10A. Specifically, when a charge-trapping region 700ct1 extends in the NAND chain between the SGD transistor 717 and the adjacent dummy memory cell 716, holes can move from the dummy memory cell to the SGD transistor and combine with electrons in the SGD transistor, reducing the Vth. See FIG. 9B and the arrow 920 showing this movement of holes. Uncorrectable errors can result when the Vth of the select gate transistors is not in a specified range.

The holes move toward the SGD transistor when there is an electric field established by a voltage difference between the control gate of the dummy memory cell and the control gate of the SGD transistor. Such an electric field can be established when a program or read operation is performed for the word lines, such as discussed in connection with FIG. 14A to 14D. Specifically, when a pass voltage is applied to a word line during a program or read operation and subsequently ramped down, the ramp down causes a down coupling in the channel voltage. The coupling then dissipates and the channel voltage increases to a nominal level, close to 0 V, while the word line voltage is floated. This results in a coupling up of the word line voltage to a positive voltage such as about 4-5 V. The positive word line voltage is desirable as it tends to keep the Vth of the memory cells at a stable level.

Moreover, a refresh operation can be performed periodically to maintain the positive word line voltage over a time period in which a program or read operation is not performed. Without a refresh operation, the coupling up of the word line voltages dissipates over a period such as several minutes. The refresh operation can involve applying a voltage pulse to the word lines which mimics the pass voltage which is used during a program or read operation, and subsequently floating the word line voltages. However, there is a conflict between the desire to refresh the word line voltages and the desire to avoid an electric field which encourages hole movement toward the select gate transistors.

Techniques provided herein address the above and other issues. In one aspect, a refresh operation which is performed repeatedly to couple up the data word line voltages but not the dummy word line voltages. The operation keeps the voltage of a control gate of a data memory cell higher than a voltage of a control gate of a dummy memory cell.

The refresh operation can involve applying a voltage pulse to the data word lines of a block when the block is not being used for a storage operation such as a program, read or erase operation. When the voltage pulse is applied to the data word lines, the dummy word lines can be set to a low level such as 0 V, which is lower than the magnitude of the voltage pulse. This low level prevents or limits coupling up of the dummy memory cells to avoid creating an electric field as mentioned above. The select gate lines can also be set to a low level.

In another aspect, the refresh operation is performed for a selected block in a set of related blocks. These are blocks which have pass transistors which are all conductive (turned on) or non-conductive (turned off) at the same time. See also FIGS. 3 and 4. For the unselected blocks in the set, the data word lines can be driven at an intermediate positive voltage which is less than the magnitude of the voltage pulse which is applied to the data word lines in the selected block. The dummy word lines and select gate lines can be set to the low level such as 0 V, as is used in the selected block. For unselected blocks which are not in the set, the pass transistors can be turned off so that the associated word line voltages float. The refresh operation can cycle through different blocks according to timers for the respective blocks until all of the blocks have been refreshed. Multiple blocks can be refreshed concurrently as well. The refresh operation is then repeated after a period of time such as several minutes.

In another aspect, a sensing operation is performed for a selected block in a set of related blocks. See also FIG. 13D. For the unselected blocks in the set, during the sensing operation, the data word lines can be driven at an intermediate positive voltage and the dummy word lines and select gate lines can be set to the low level such as 0 V. For unselected blocks which are not in the set, the pass transistors can be turned off so that the associated word line voltages float. A timer is set, and upon expiration of the timer, a refresh operation is performed for the selected block. For the unselected blocks in the set, during the refresh operation, the data word lines can be driven at the intermediate positive voltage and the dummy word lines and select gate lines can be set to the low level such as 0 V.

These and other features are discussed further below.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 116 (power control circuit), a maintenance circuit 117 and a trigger circuit 119. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIGS. 3 and 4. The sense blocks can include bit line drivers, in one approach. The maintenance circuit 117 is a general maintenance circuit that can perform refresh operations as described herein and other maintenance operations such as garbage collection, wear leveling and so forth.

Garbage collection operations can involve erasing blocks of unneeded data to make blocks available for writing new data. This can include merging partially filled erase blocks, emptying erase blocks containing only invalid and/or outdated data, and other flash memory maintenance tasks. Wear leveling can include arranging data so that write/erase cycles are distributed evenly among all of the blocks in the device. This can involve using a count of P-E cycles for each block to identify a block to be programmed.

Figure 3:
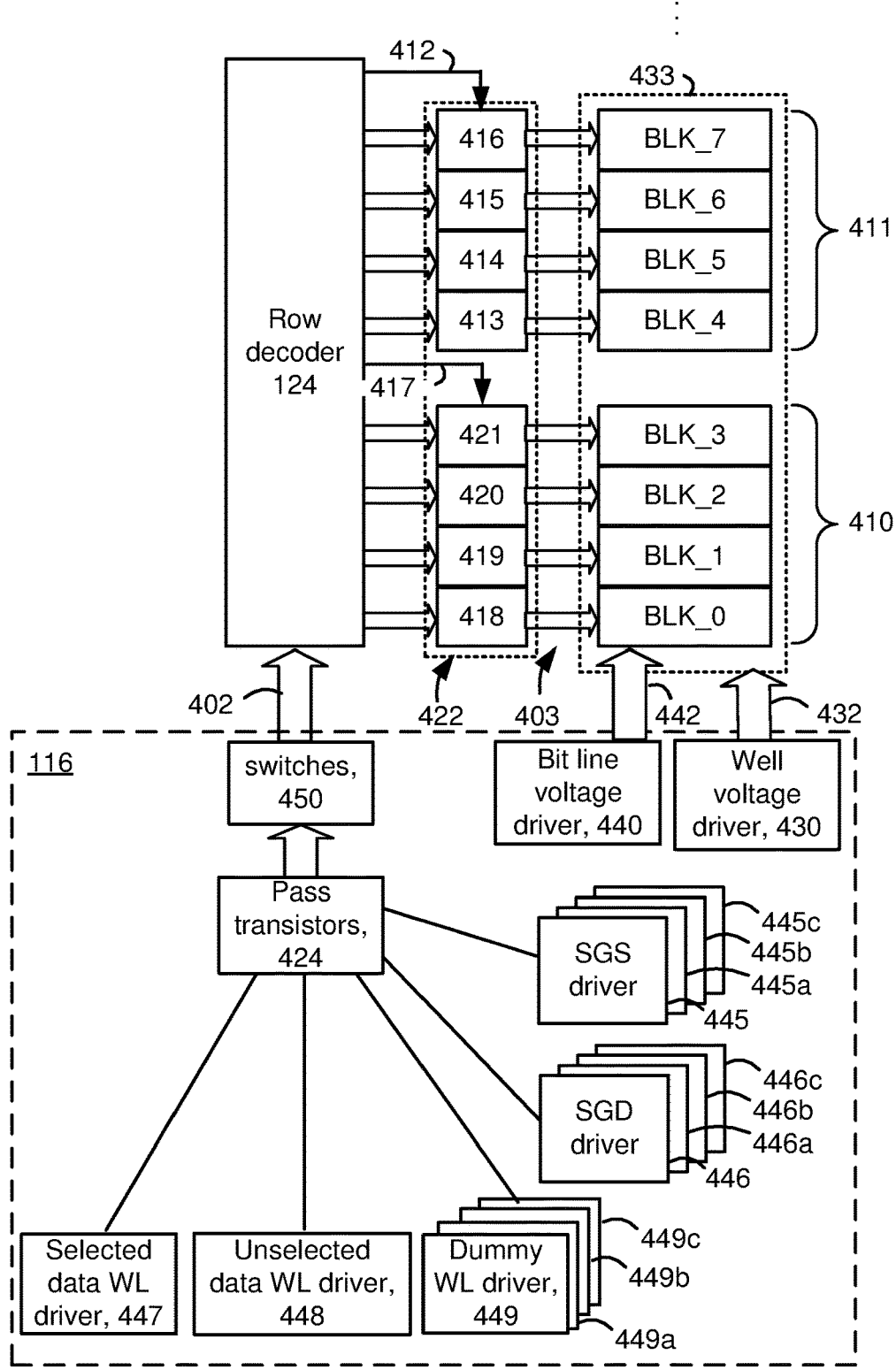
FIG. 3 depicts an example implementation of the power control module 116 of FIG. 1A for providing voltages to blocks of memory cells.
Figure 4:
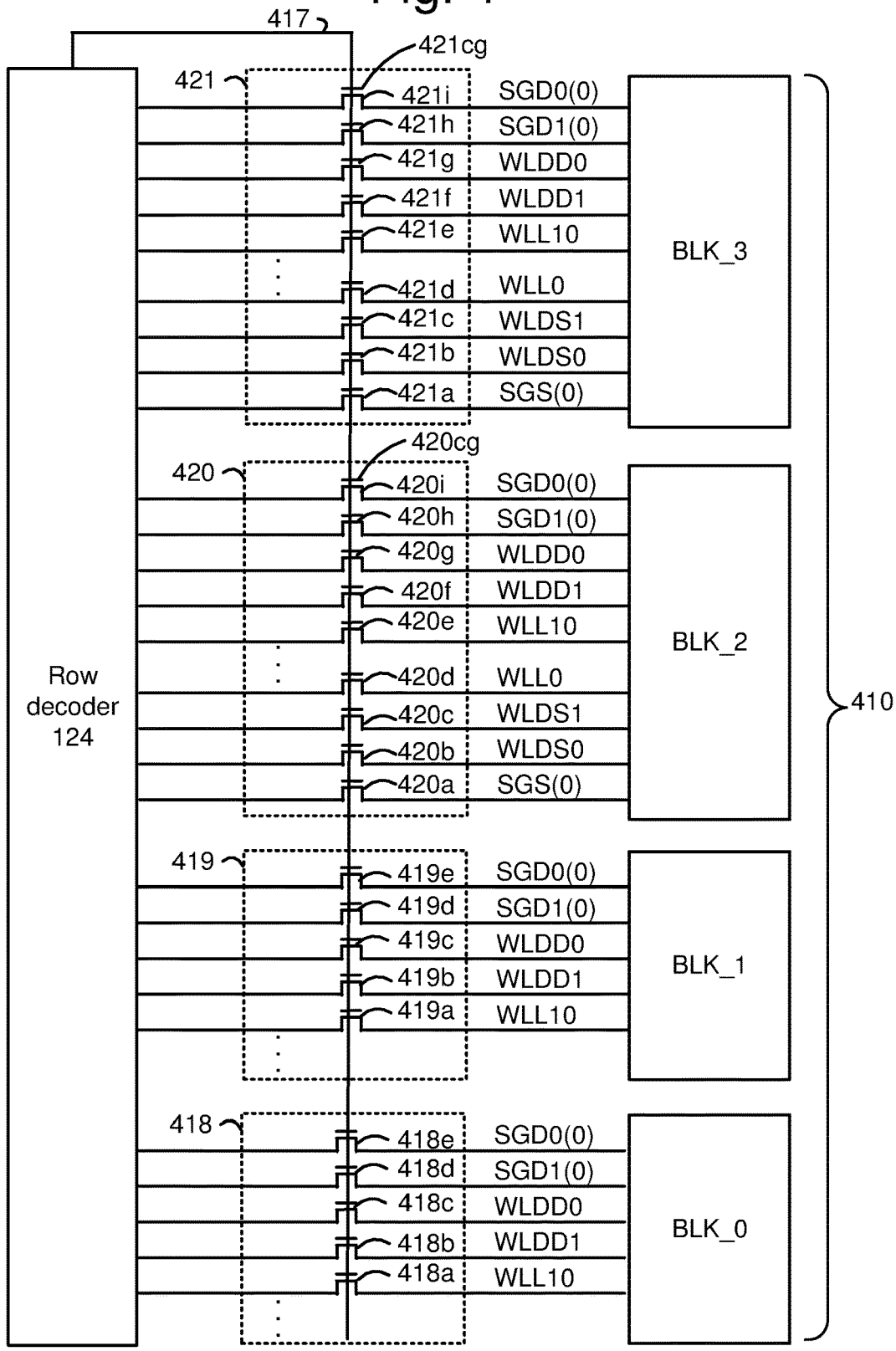
FIG. 4 depicts example details of the sets of pass transistors 418-421 of FIG. 3 for the set 410 of blocks, showing the common control gate line 417.

The refresh operations can be used to repeatedly increase the voltages of the data word lines to maintain them in a coupled up state to help stabilize the Vth levels of the data memory cells, as mentioned previously. The maintenance circuit 117 can implement the maintenance operations by controlling voltage drivers and pass gate transistors such as depicted in FIGS. 3 and 4 using the power control module 116. The maintenance circuit may be responsive to a trigger circuit 119 which determines when a condition is met for the maintenance circuit to perform its operations. The trigger circuit may comprise a timer or a power on event detector which detects when the memory device has been powered on, for example. The trigger circuit may also track program-erase cycles in a block and set a corresponding time period T in which a refresh operation should be performed, such as depicted in FIG. 10D.

The maintenance circuit, trigger circuit and power control module may include hardware, software and/or firmware for performing the processes described herein. See FIG. 1B for example details of the trigger circuit and FIG. 1C for example details of the maintenance circuit.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122*c*, storage devices (memory) such as ROM 122*a* and RAM 122*b* and an error-correction code (ECC) engine 245. The ECC engine can correct a number of read errors.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND chain is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND chain within a single horizontal (e.g., x-y) memory device level. Alternatively, the memory elements may be coupled together to form a vertical NAND chain that traverses across multiple horizontal memory device levels. Other 3D configurations can be envisioned wherein some NAND chains contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example implementation of the trigger circuit 119 of FIG. 1A. The trigger circuit includes a power on event detector 119a, such as an event handler, which detects a power on event in the memory device. For example, a power on event may occur when a user manually powers on a device such as a cell phone which includes the memory device 100. The power on event detector may provide an event signal to a decision logic block 119d. The trigger circuit may also include a P-E cycle counter 119b which provides an indication of a number of P-E cycles in one or more blocks to a refresh period calculator 119c. The refresh period calculator 119c may convert a number of P-E cycles to a timer period T using the plot of FIG. 10D, for example. The timer period T in turn is provided to a timer 119b for use in counting the time until a next refresh operation. The timer 119b may begin counting in response to a set or reset signal from the decision logic block, as discussed, e.g., in connection with FIG. 13A, step 1302. The timer 119b provides an expire signal to the decision logic block 119d when the timer expires, e.g., when the period T elapses. The decision logic block 119d can use the event and expire signals to provide an initiate refresh signal to the maintenance circuit 117. The decision logic block 119d can include hardware, software and/or firmware for performing the processes described herein.

Figure 1C:
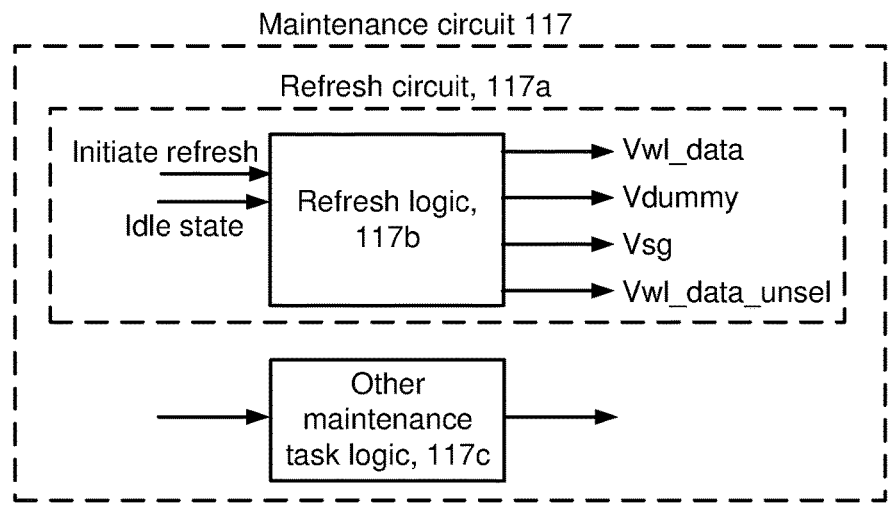
FIG. 1C depicts another embodiment of the maintenance circuit 117 of FIG. 1A.

FIG. 1C depicts another embodiment of the maintenance circuit 117 of FIG. 1A. The maintenance circuit 117 includes a refresh circuit 117a which, in turn, includes a refresh logic block 117b. The refresh circuit can include hardware, software and/or firmware for performing the processes described herein. Inputs to the refresh logic block 117b include an initiate refresh signal from the trigger circuit 119 and an idle state input from the state machine 112 or controller 122, for example. It is possible that the trigger circuit 119 issues the initiate refresh signal for a block which is not in the idle state. In this case, the refresh operation may be delayed until the block is in the idle state, or the refresh operation may not be performed if another operation is performed, such as a program or read which renders the refresh operation unnecessary. If the refresh logic block 117b decides to perform a refresh operation, it provides requested voltages to the power control module. These voltages can include Vwl_data, Vdummy, Vsg and Vwl_data_unsel, as described further below, such as in connection with FIG. 15A-15G. The power control module implements the requested voltages by appropriately controlling of the voltage drivers.

The maintenance circuit 117 also includes another maintenance task logic block 117c which receives input signals and provides output signals to perform other maintenance tasks. For example, an input for a garbage collection operation can identify blocks and pages which contain unneeded data, and an output can identify blocks and pages to which data is to be written or erased. An input for a wear leveling operation can a count of P-E cycles for each block, and an output can identify a next block to be programmed.

FIG. 2 is a block diagram depicting one embodiment of the sense block 51 of FIG. 1A. An individual sense block 51 is partitioned into one or more core portions, referred to as sense circuits 180-183 or sense amplifiers, and a common portion, referred to as a managing circuit 190. In one embodiment, there will be a separate sense circuit for each bit line/NAND chain and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

The sense circuit 180, as an example, comprises sense circuitry 170 that performs sensing by determining whether a conduction current in a connected bit line is above or below a predetermined threshold level. Sense circuit 180 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming.

The managing circuit 190 comprises a processor 192, four example sets of data latches 194-197 and an I/O Interface 196 coupled between the set of data latches 194 and data bus 120. One set of data latches, e.g., LDL and UDL, can be provided for each sense circuit. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense circuit 180 may trip at one of these voltages and a corresponding output will be provided from sense circuit 180 to processor 192 via bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL and UDL latches, in a two-bit per storage element implementation. In a three-bit per storage element implementation, an additional data latch may be used. The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuitry sets it to an inhibit value during the verify process.

Each set of data latches 194-197 may be implemented as a stack of data latches for each sense circuit. In one embodiment, there are three data latches per sense circuit 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

FIG. 3 depicts an example implementation of the power control module 116 of FIG. 1A for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively. See further details in FIG. 4.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation, a driver 448 for unselected data word lines, and dummy word line drivers 449-449c which provide voltages on dummy word lines. For example, the dummy word line drivers 449, 449a, 449b and 449c may provide voltages on the control gate layers or word line layers WLDD0, WLDD1, WLDS1 and WLDS0, respectively, in FIG. 6A, during a refresh operation as described herein.

The voltage drivers can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIGS. 7, 8A and 8B. In another option, one SGS driver is common to the different sub-blocks in a block.

The various components, including the row decoder, may receive commands from a controller such as the state machine 112 or the controller 122 to perform the functions described herein.

The well voltage driver 430 provides a voltage Vsource to the well region 611a (see FIGS. 6A and 8B) in the substrate, via control lines 432. In one approach, the well region 433 is common to the blocks. A set of bit lines 442 is also shared by the blocks. A bit line voltage driver 440 provides voltages to the bit lines. In a stacked memory device such as depicted in FIGS. 5 to 8B, sets of connected memory cells may be arranged in NAND chains which extend vertically upward from the substrate. The bottom (or source end) of each NAND chain is in contact with the well region, and the top end (or drain end) of each NAND chain is connected to a respective bit line, in one approach.

FIG. 4 depicts example details of the sets of pass transistors 418-421 of FIG. 3 for the set 410 of blocks, showing the common control gate line 417. Each set of pass transistors may include a separate pass transistor for each respective control gate line of a respective block. For example, the set 418 includes example pass transistors 418a-418e for control gate lines WLL10-SGD0(0) in BLK_0, the set 419 includes example pass transistors 419a-418e for control gate lines WLL10-SGD0(0) in BLK_1, the set 420 includes example pass transistors 420a-420d and 420e-420i for control gate lines SGS(0)-WLL0 and WLL10-SGD0(0) in BLK_2, and the set 421 includes example pass transistors 421a-421d and 421e-421i for control gate lines SGS(0)-WLL0 and WLL10-SGD0(0) in BLK_3. The example pass transistors 420i and 421i include control gates 420cg and 421cg, respectively. For simplicity, some pass transistors and control gate lines are omitted from the figure.

The blocks BLK0-BLK3 are related in that their pass transistors are driven by a common voltage on the common control gate line 417. The control line is connected to the control gate of each pass transistor such that the control gates of the pass transistors in the set of blocks are connected to one another. This example includes four related blocks, but the principle applies to two or more related blocks. The purpose of connecting the pass transistors in different blocks is to reduce the number of control lines which are used in the memory device.

In another option, the pass transistors can be driven independently in each block.

Figure 5:
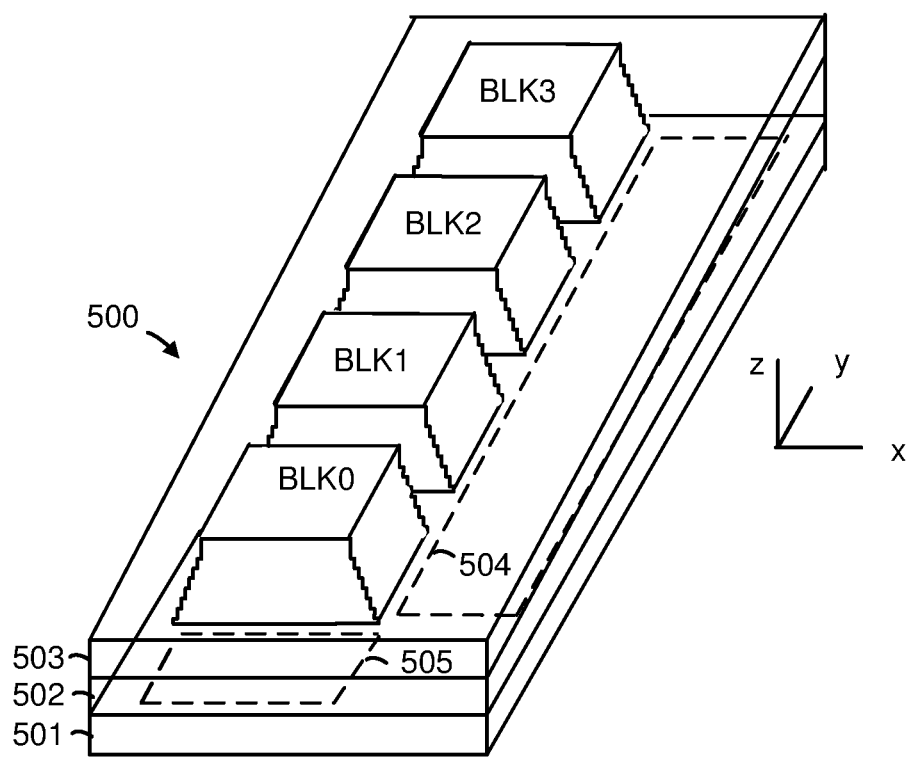
FIG. 5 is a perspective view of a memory device 500 comprising a set of blocks in an example 3D configuration of the memory structure 126 of FIG. 1A.

FIG. 5 is a perspective view of a memory device 500 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 6C:
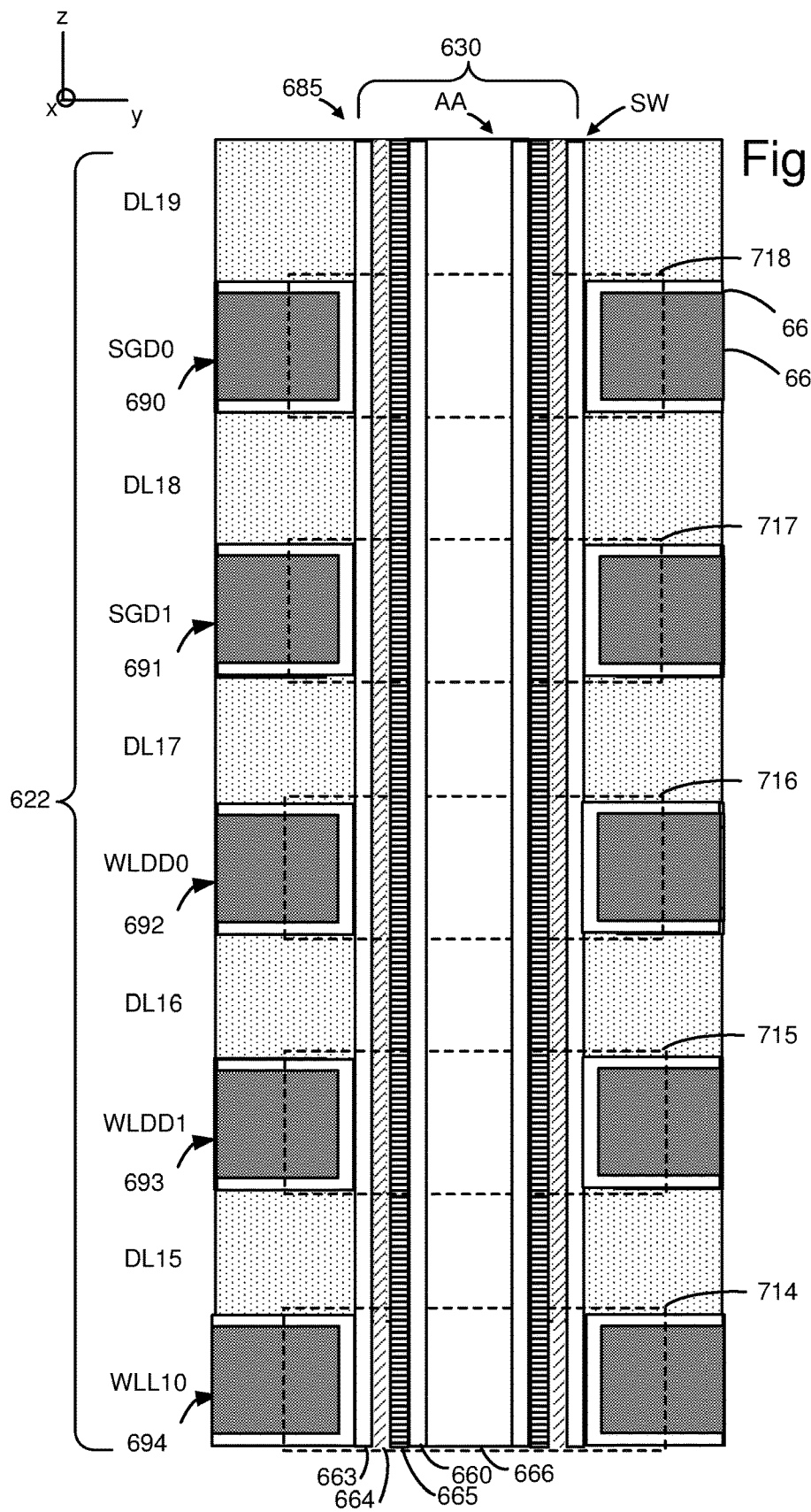
FIG. 6C depicts a close-up view of the region 622 of the stack of FIG. 6A.

FIG. 6A depicts an example cross-sectional view of a portion of the block BLK0 of FIG. 5. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND chains 700n and 710n are depicted. Each NAND chain encompasses a memory hole 618 or 619 which is filled with materials which form memory cells adjacent to the word lines. Region 622 of the stack is shown in greater detail in FIG. 6C.

The stack includes a substrate 611. In one approach, a portion of the source line SL comprises a well region 611a as an n-type source diffusion layer or well in the substrate. The well region is in contact with a source end of each string of memory cells in a block. An erase pulse may be applied to this layer in an erase operation The n-type well region 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NAND chain 700n has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts an example transistor 650. The transistor comprises a control gate CG, a drain D, a source S and a channel CH and may represent a memory cell or a select gate transistor, for example.

FIG. 6C depicts a close-up view of the region 622 of the stack of FIG. 6A. Memory cells are formed at the different levels of the stack at the intersection of a word line layer and a memory hole. In this example, SGD transistors 718 and 717 are provided above dummy memory cells 716 and 715 and a data memory cell 714. These SGD transistors are at the drain end of the NAND chain. The problem of Vth downshift as mentioned at the outset occurs mainly with the SGD transistor 717 which is adjacent to the dummy memory cell 716. By avoiding or reducing an electric field between the dummy memory cells and the select gate transistors in a refresh operation as described herein, the Vth downshift of the SGD transistor 717 can be reduced. The other drain-side dummy memory cell 715 could have a secondary effect on the SGD transistor 717. One approach which accounts for this possible secondary effect sets a low voltage for both dummy memory cells 715 and 716 during a voltage pulse on data word lines. Another approach which discounts this possible secondary effect sets a low voltage on the dummy memory cell 716 and a pass voltage on the dummy memory cell 715.

Figure 7:
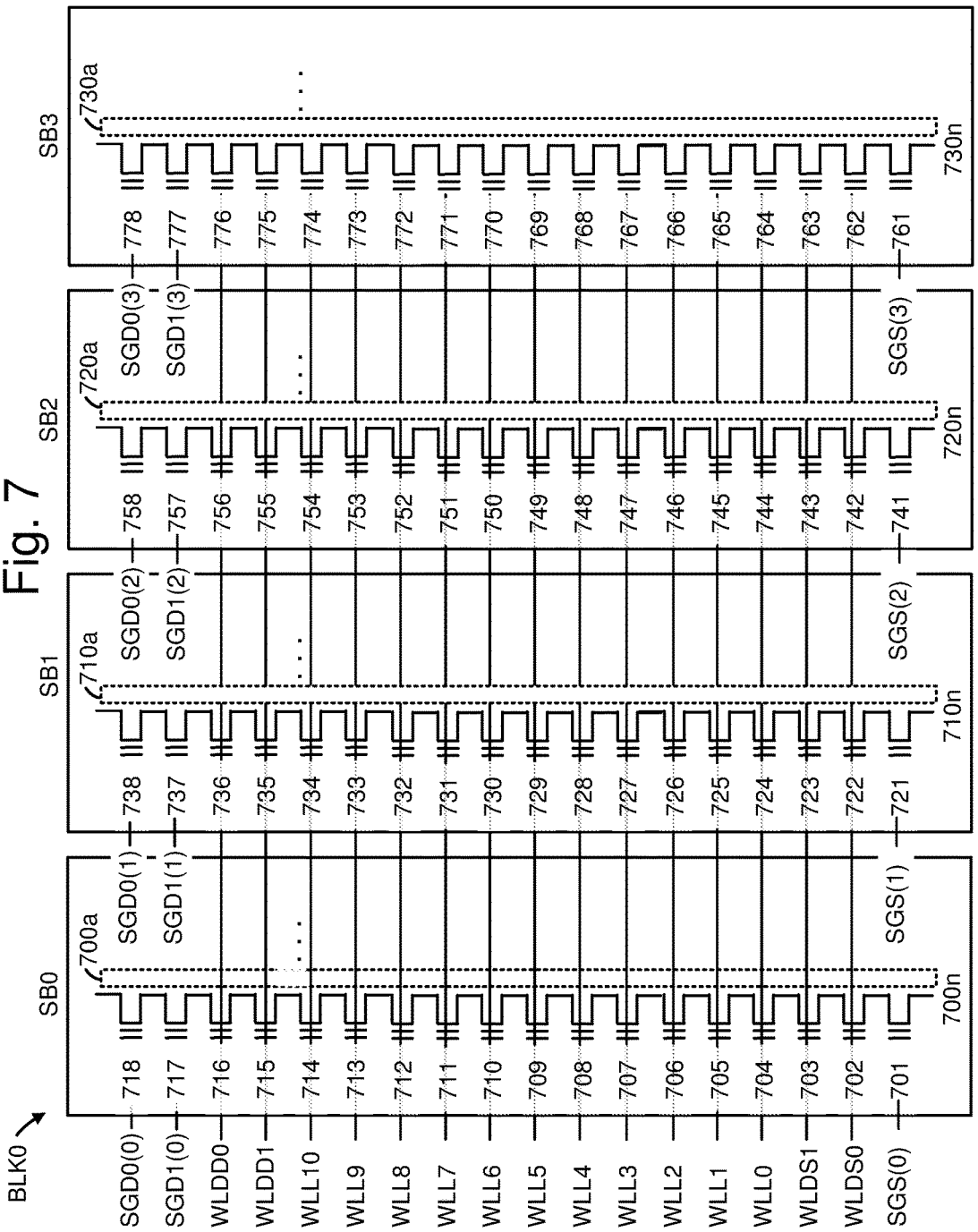
FIG. 7 depicts an example view of NAND chains in a block BLK0 which is consistent with FIGS. 5 and 6A.

The problem of Vth downshift can also occur with the SGS transistor 701 which is adjacent to the dummy memory cell 702 in FIG. 7. By avoiding or reducing an electric field between the dummy memory cells and the select gate transistors in a refresh operation as described herein, the Vth downshift of the SGS transistor 701 can be reduced. The other source-side dummy memory cell 703 could have a secondary effect on the SGS transistor 701. One approach which accounts for this possible secondary effect sets a low voltage for both dummy memory cells 702 and 703 during a voltage pulse on data word lines. Another approach which discounts this possible secondary effect sets a low voltage on the dummy memory cell 702 and a pass voltage on the dummy memory cell 703.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665, a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND chain.

Each NAND chain or set of connected transistors comprises a channel which extends continuously from one or more source-end select gate transistors to one or more drain-end select gate transistors. For example, the channels 700a, 710a, 720a and 730a extend continuously in the NAND chains 700n, 710n, 720n and 730n, respectively. The channel 700a extends continuously in the NAND chains 700n from the SGS transistor 701 to the SGD transistors 717 and 718. The channel 700a is continuous in that it is uninterrupted and can therefore provide a continuous conductive path in the NAND chain.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND chain can be considered to have a floating body channel because the length of the channel is not formed on a substrate. Further, the NAND chain is provided by a plurality of word line layers above one another in a stack, and separated from one another by dielectric layers.

FIG. 7 depicts an example view of NAND chains in the block BLK0 which is consistent with FIGS. 5 and 6A. The NAND chains are arranged in sub-blocks of the block in a 3D configuration. Each sub-block includes multiple NAND chains, where one example NAND chain is depicted. For example, SB0, SB1, SB2 and SB3 comprise example NAND chains 700n, 710n, 720n and 730n, respectively. The NAND chains have data word lines, dummy word lines and select gate lines consistent with FIG. 6A. Each sub-block comprises a set of NAND chains which extend in the x direction and which have a common SGD line or control gate layer. The NAND chains 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. Another option programs all of the memory cells in one sub-block, one word line at a time, before programming the memory cells of the next sub-block. The word line programming order may start at WL0, the source-end word line and end at WLL10, the drain-end word line, for example.

The NAND chains 700n, 710n, 720n and 730n have channels 700a, 710a, 720a and 730a, respectively.

Additionally, NAND chain 700n includes SGS transistor 701, dummy memory cells 702 and 703, data memory cells 704, 705, 706, 707, 708, 709, 710, 711, 712, 713 and 714, dummy memory cells 715 and 716, and SGD transistors 717 and 718.

NAND chain 710n includes SGS transistor 721, dummy memory cells 722 and 723, data memory cells 724, 725, 726, 727, 728, 729, 730, 731, 732, 733 and 734, dummy memory cells 735 and 736, and SGD transistors 737 and 738.

NAND chain 720n includes SGS transistor 741, dummy memory cells 742 and 743, data memory cells 744, 745, 746, 747, 748, 749, 750, 751, 752, 753 and 754, dummy memory cells 755 and 756, and SGD transistors 757 and 758.

NAND chain 730n includes SGS transistor 761, dummy memory cells 762 and 763, data memory cells 764, 765, 766, 767, 768, 769, 770, 771, 772, 773 and 774, dummy memory cells 775 and 776, and SGD transistors 777 and 778.

One or more SGD transistors are provided at the drain-end of each NAND chain, and one or more SGS transistors are provided at the source-end of each NAND chain. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by separate control lines SGS(0), SGS(1), SGS(2) and SGS(3), respectively. In another approach, all of the SGS transistors in a block are connected and commonly driven.

Figure 8A:
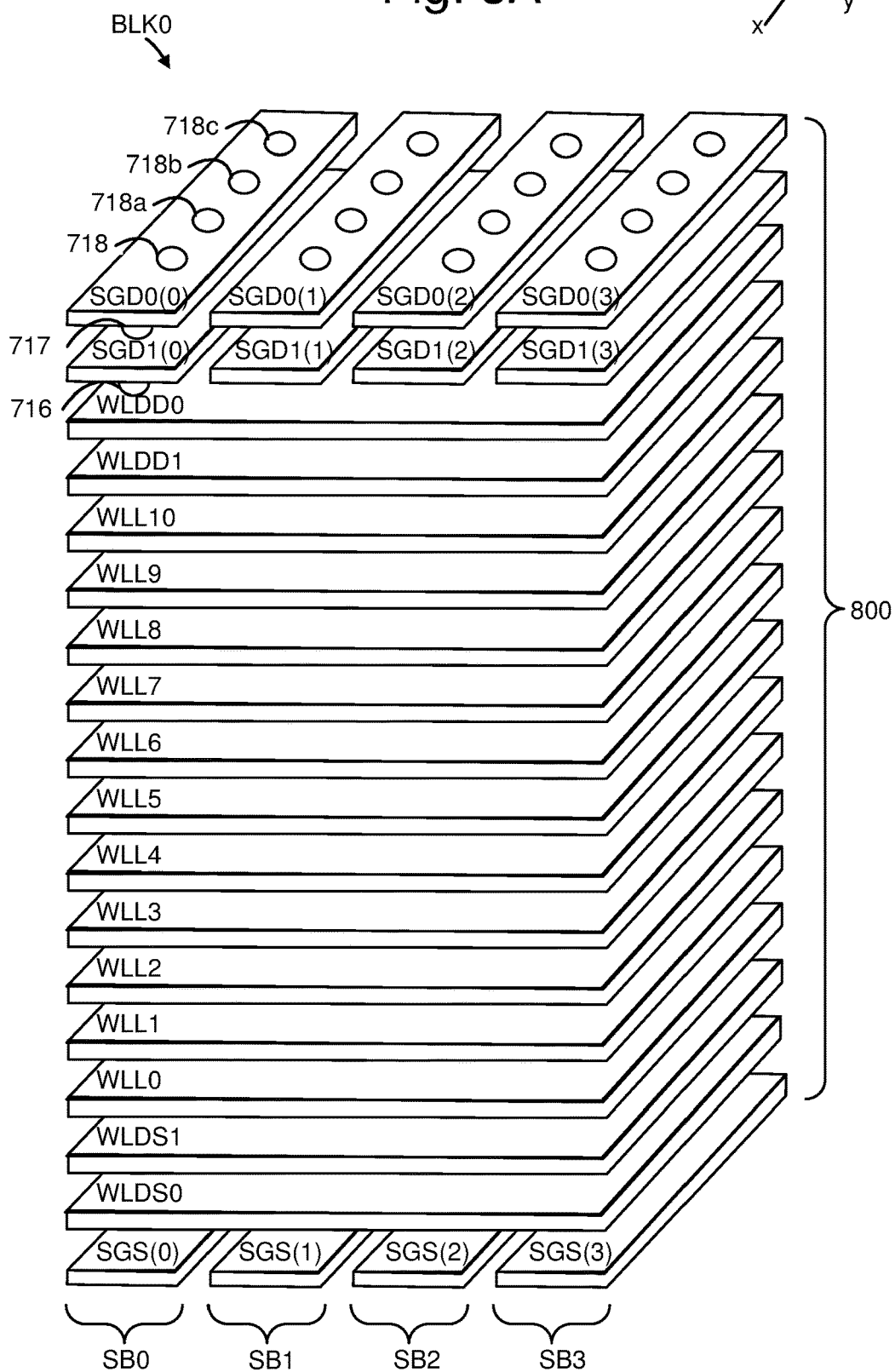
FIG. 8A depicts control gate layers in the block BLK0 consistent with FIG. 7.

FIG. 8A depicts control gate layers in the block BLK0 consistent with FIG. 7. The control gate layers are arranged in a stack 800 and include dummy word lines layers or control gate layers WLDS0, WLDS1, WLDD0 and WLDD1, and data word line layers or control gate layers WLL0-WLL10, which are shared among the different sub-blocks SB0-SB3. The control gate layers include a separate SGS control gate layer for each sub-block, e.g., SGS(0)-SGS(3) and separate SGD control gate layers for each sub-block. For example, SB0 includes SGD0(0) and SGD1(0), SB1 includes SGD0(1) and SGD1(1), SB2 includes SGD0(2) and SGD1(2), and SB3 includes SGD0(3) and SGD1(3). Additionally, four example memory holes are depicted in each sub-block. SGD transistors 718, 718a, 718b and 718c are depicted in SGD0(0), SGD transistor 717 is depicted in SGD1(0) and dummy memory cell 716 is depicted in WLDD0.

Figure 8B:
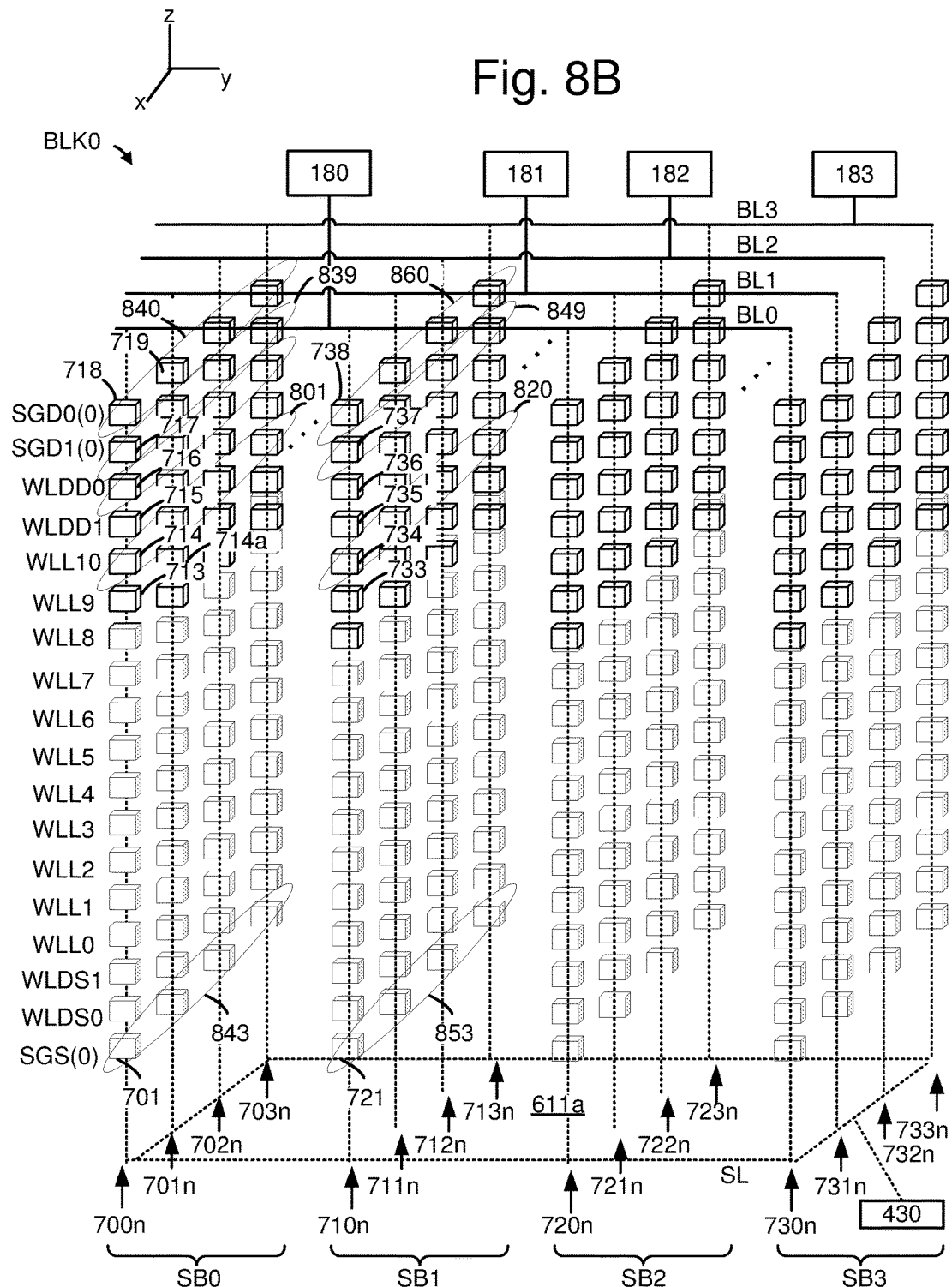
FIG. 8B depicts additional detail of the block BLK0 of FIG. 7.

FIG. 8B depicts additional detail of the block BLK0 of FIG. 7. Example memory cells are depicted which extend in the x direction along word lines in each sub-block. Each memory cell is depicted as a cube for simplicity. SB0 includes NAND chains 700n, 701n, 702n and 703n. SB1 includes NAND chains 710n, 711n, 712n and 713n. SB2 includes NAND chains 720n, 721n, 722n and 723n. SB3 includes NAND chains 730n, 731n, 732n and 733n. Bit lines are connected to sets of NAND chains. For example, a bit line BL0 is connected to NAND chains 700n, 710n, 720n and 730n, a bit line BL1 is connected to NAND chains 701n, 711n, 721n and 731n, a bit line BL2 is connected to NAND chains 702n, 712n, 722n and 732n, and a bit line BL3 is connected to NAND chains 703n, 713n, 723n and 733n. Sense circuits may be connected to each bit line. For example, sense circuits 180, 181, 182 and 183 of FIG. 2 are connected to bit lines BL0, BL1, BL2 and BL3.

Programming and reading can occur for selected cells in one word line and one sub-block at a time. This allows each selected cell to be controlled by a respective bit line and/or source line. For example, a set of memory cells 801, which includes an example memory cell 714, is connected to WLL10 in SB0. This is the drain-end data word line. WLL0 is the source-end data word line. A set of memory cells may be programmed or read concurrently. An additional set of memory cells is connected to WLL10 in each of the other sub-blocks SB1-SB3. For example, a set of memory cells 820, which includes an example memory cell 734, is connected to WLL10 in SB1.

In this example, the source line SL or source region is driven at a voltage Vsource by the well voltage driver 430.

Each NAND chain includes one or more SGD transistors at the drain-end and one or more SGS transistors at the source end. In this case, there are two SGD transistors and one SGS transistor per string. Each SGD transistor may be connected to separate control line layer, as in FIG. 8A, so that it can be driven separately, or the two or more SGD transistors in a string may have their control gates connected and commonly driven. For example, SB0 has sets of SGD transistors 840 and 839, with example SGD transistors 718 and 717, respectively, in the NAND chain 700n. The set of SGD transistors 840 also includes an example SGD transistor 719 in the NAND chain 701n. SB0 also has a set of SGS transistors 843, with an example SGS transistor 701 in the NAND chain 700n. Similarly, SB1 has sets of SGD transistors 860 and 849, with example SGD transistors 738 and 737, respectively, in the NAND chain 710n. SB1 also has a set of SGS transistors 853, with an example SGS transistor 721 in the NAND chain 710n.

The NAND chain 700n includes SGD transistors 718 and 717 connected to select gate lines SGD0(0) and SGD1(0), respectively, dummy memory cells 716 and 715 connected to WLDD0 and WLDD1, respectively, and data memory cells 714 and 713 connected to WLL10 and WLL9, respectively. The NAND chain 710n includes SGD transistors 738 and 737 connected to select gate lines SGD0(1) and SGD1(1) (see FIG. 7), respectively, dummy memory cells 736 and 735 connected to WLDD0 and WLDD1, respectively, and data memory cells 734 and 733 connected to WLL10 and WLL9, respectively.

Figure 9A:
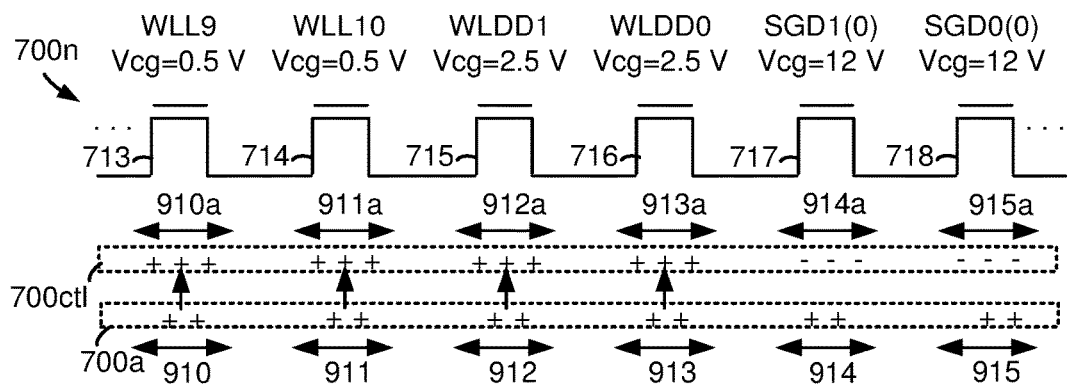
FIG. 9A depicts a plot of a portion of the NAND chain 700n of FIGS. 7 and 8B during an erase operation, showing how holes (+) are collected in a portion 913a of a charge-trapping layer 700ct1 adjacent to a dummy memory cell 716 while electrons are stored in a portion 914a of the charge-trapping layer adjacent to a select gate transistor 717.

FIG. 9A depicts a plot of a portion of the NAND chain 700n of FIGS. 7 and 8B during an erase operation, showing how holes (+) are collected in a portion 913a of a charge-trapping layer 700ct1 within a dummy memory cell 716 while electrons are stored in a portion 914a of the charge-trapping layer within a select gate transistor 717. The portions 913a and 914a are adjacent to the WLDD0 and SGD1(0) control gate layers, respectively.

Figure 9B:
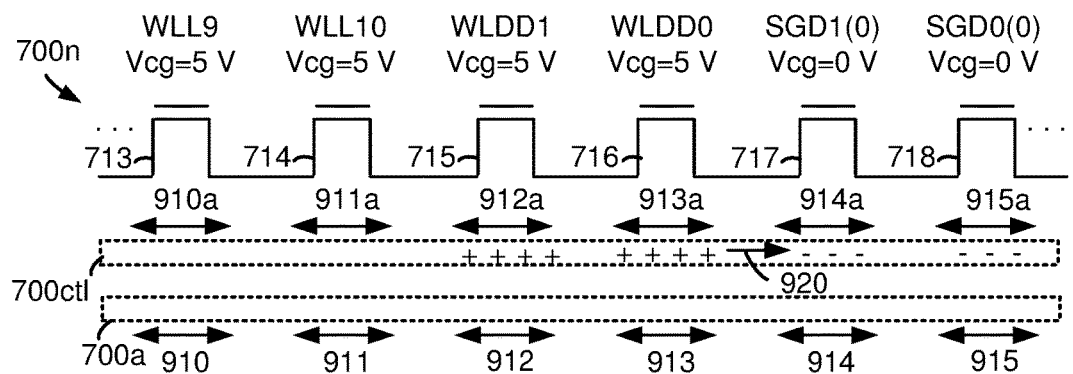
FIG. 9B depicts a plot of the portion of the NAND chain of FIG. 9A when the word line voltages coupled up after a read or programming process consistent with FIG. 14A to 14D, showing how holes (+) can migrate from the portion 913a to the portion 914a of the charge-trapping layer 700ct1, resulting in charge loss for the select gate transistor 717.

In FIGS. 9A and 9B, a portion of the NAND chain 700n and its channel 700a and charge trapping layer 700ct1 are depicted. See also FIGS. 7 and 8B. The portion of the NAND chain shown is at the drain side of the NAND chain and includes the SGD transistors 718 and 717 connected to SGD0(0) and SGD1(0), respectively, the dummy memory cells 716 and 715 connected to WLDD0 and WLDD1, respectively, and the data memory cells 714 and 713 connected to WLL10 and WLL9, respectively. The remaining data memory cells and the SGS transistor extend to the left in the figure.

In the selected NAND chain 700n, the SGD transistors 718 and 717 include channel portions 915 and 914, respectively, and charge trapping layer portions 915a and 914a, respectively. The dummy memory cells 716 and 715 include channel portions 913 and 912, respectively, and charge trapping layer portions 913a and 912a, respectively. The data memory cells 714 and 713 include channel portions 911 and 910, respectively, and charge trapping layer portions 911a and 910a, respectively. Two drain-end dummy memory cells are provided as an example. In practice, one or more drain-end dummy memory cells can be provided in each NAND chain.

Each select gate transistor or memory cell has a threshold voltage (Vth) and a control gate or word line voltage. Typical values can include Vth=2 V for the SGD transistors and Vth=1 V for the dummy memory cells. The Vth of a data memory cell can vary based on whether the memory cell is programmed, and if it is programmed, based on its data state. The Vth of data memory cells may range from 0-5 V, for example. Generally, the programming of the memory cells is random so that a NAND chain will have cells in different states.

In the erase operation, in one approach, the voltages on SGD0(0) and SGD1(0) float at a level such as Vcg=12 V, the voltages on WLDD0 and WLDD1 are driven at Vwl_dd0 and Vwl_dd1, e.g., Vcg=1.5 V and 1 V, respectively, and the voltages on WLL10 and WLL9 are driven at Vwl_data, e.g., Vcg=0.5 V. The channel is charged up to a relatively high level such as 14 V so that the memory cells have a high channel-to-gate voltage and are erased. The dummy memory cells have a higher Vcg (and thus a lower channel-to-gate voltage) than the data memory cells so the dummy memory cells are slightly less deeply erased than the data memory cells. Moreover, the dummy memory cell 716 of WLDD0 may be slightly less deeply erased than the dummy memory cell 715 of WLDD1 since the dummy memory cell 716 has a higher control gate voltage and therefore a lower channel-to-gate voltage than the dummy memory cell 715.

The charged state of the channel is represented by the holes (+). Due to the high control gate voltage of the SGD transistors, the holes in the channel portions 914 and 915 are not drawn into the charge trapping layer portions 914a and 915a to erase these transistors. Moreover, the SGD transistors may be programmed to a Vth such as 2 V at the time of manufacture. This programmed state is represented by the electrons (−) in the charge trapping layer portions 914a and 915a. Holes in the channel portions 910-913 tunnel from the channel into the charge trapping layer portions 910a-913a, respectively, g channel, e.g, ng which extends vertically from a substrate 272727272727272727272727272727272727272727272727272727272727272727272727 272727272727272727272727272727272727 and are stored there. The holes will combine with any electrons in the charge trapping layer to erase these cells. The movement of the holes is represented by the vertical arrows.

To perform the erasing, an erase bias is provided for the data and dummy memory cells by the circuitry 110 in FIG. 1A.

FIG. 9B depicts a plot of the portion of the NAND chain of FIG. 9A when the word line voltages coupled up after a read or programming process consistent with FIG. 14A to 14D, showing how holes (+) can migrate from the portion 913a to the portion 914a of the charge-trapping layer 700ct1, resulting in charge loss for the select gate transistor 717. The control gate (word line) voltages for the dummy and data memory cells can be coupled up after a program or read operation is performed, as explained in connection with FIG. 14A to 14D. An example coupled up voltage of 5 V is depicted for the Vcg of the memory cells 716-713. With 5 V on the control gate on the dummy memory cell 716 and 0 V (a ground voltage) on the control gate of the adjacent SGD transistor 717, an electric field (where the voltage is higher on the dummy memory cell 716 than the SGD transistor 717) is created between these transistors which causes some of the holes which have been stored in the charge trapping layer portion 913a (and potentially even the charge trapping layer portion 912a) after the erase operation to move toward the electrons which have been stored in the charge trapping layer portion 914a of the SGD transistor 717. This movement is represented by a horizontal arrow and is due to the Poole-Frankel effect. The holes will combine with the electrons, resulting in a charge loss for the SGD transistor 717. The charge loss is seen as a Vth downshift, as depicted in FIG. 10A. Moreover, more holes will move as time passes and the electric field is present, making the downshift worse. This process is repeated when the memory cells are subsequently erased, programmed and read.

Note that the SGD transistor 718 which is not adjacent to the dummy memory cell 716 does not typically experience this charge loss.

The techniques provided herein allow coupling up of data word line voltages in periodic refresh operations while preventing or discouraging coupling up of dummy word line voltages.

Note also in FIG. 9B that the NAND chain 700n is an example of a set of connected memory cells comprising a data memory cell 714 adjacent to one or more dummy memory cells 715 and 716, where the one or more dummy memory cells comprise a dummy memory cell 716 positioned adjacent to a select gate transistor 717.

FIG. 10A depicts a threshold voltage distribution of select gate transistors for a fresh memory device (plot 1000) and for a cycled memory device (plot 1001) in which a Vth downshift occurs. The vertical axis depicts a number of SGD transistors on a log scale and the horizontal axis depicts Vth. Initially, the SGD transistors are programmed to have a Vth which is greater than a verify voltage, VvSGD, such as at the time of manufacture. See also FIG. 12B. The Vth distribution just after the completion of programming is represented by the plot 1000. As the block becomes cycled, e.g., as many P-E cycles are performed, the lower tail of the Vth distribution tends to downshift for reasons mentioned previously, e.g., in connection with FIGS. 9A and 9B. The downshifted Vth is represented by the plot 1001. In this case, no countermeasure is performed to reduce the downshift.

The techniques described herein provide a countermeasure which tends to maintain the Vth distribution at the level represented by plot 1000.

The downshift in Vth has been observed in particular for SGD transistors in a 3D memory architecture consistent with FIG. 6A-8B, in which a set of connected memory cells are arranged in a NAND string or chain which extends vertically upward from a substrate. However, the SGS transistors are expected to experience a similar problem. The countermeasures described herein are therefore applicable to both the source and drain side dummy memory cells.

FIG. 10B depicts a plot of fail bit count versus the voltage of the lower tail of the Vth distribution of FIG. 10A, showing how the fail bit count increases as the Vth is downshifted. The vertical axis depicts a number of fail bits, or memory cells in which an uncorrectable error occurs, on a log scale and the horizontal axis depicts the SGD lower tail Vth. As mentioned at the outset, errors can result when the Vth of the select gate transistors is not in a specified range. An uncorrectable error occurs when the assigned data state of a memory cell cannot be distinguished in a read operation, even after applying ECC techniques. This plot confirms that there is an increase in the number of errors if the SGD lower tail Vth downshifts. The countermeasures described herein can help avoid an increase in such errors.

FIG. 10C depicts a plot of an SGD lower tail Vth versus a number of program-erase cycles, showing how the Vth downshift becomes worse as the number of P-E cycles increases. The vertical axis depicts the SGD lower tail Vth and the horizontal axis depicts a number of P-E cycles. As depicted in FIG. 10A, the SGD lower tail Vth downshifts over time as P-E cycles are performed. Each P-E cycle results in the injection of holes into the charge trapping layer of the dummy memory cells (FIG. 9A) as well as an electric field which causes the holes to migrate towards the select gate transistors (FIG. 9B).

FIG. 10D depicts a plot of a time period T for performing a refresh operation versus a number of program-erase cycles. The timer period T can be a decreasing function of the number of P-E cycles. The timer period is discussed also at step 1302 of FIG. 13A. Since the problem of the Vth downshift of the select gate transistors is less severe when the memory device is fresh and has relatively few P-E cycles, the period for performing a refresh operation can be greater. That is, the frequency of performing the refresh operation can be smaller. As the number of cycles increases, the period for performing the refresh operation can be smaller and the frequency of performing the refresh operation can be greater.

Figure 13A:
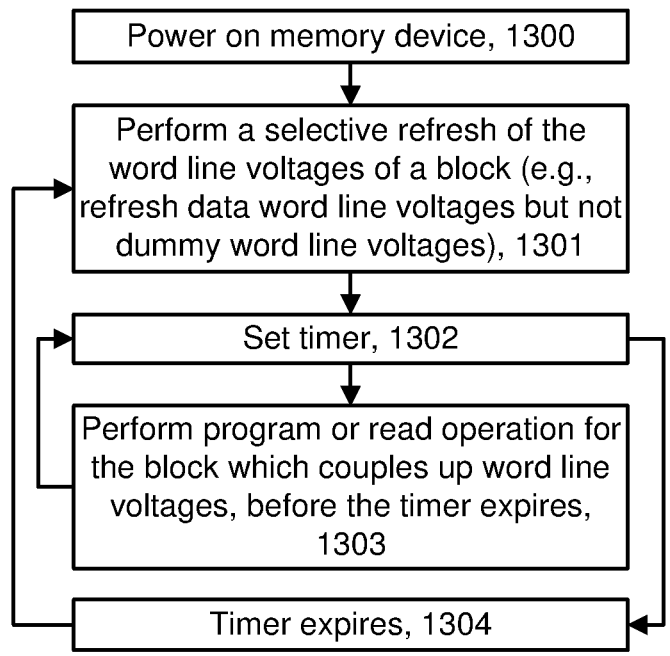
FIG. 13A depicts a process for repeatedly refreshing data word line voltages without refreshing dummy word line voltages.

FIG. 11 depicts an example Vth distribution of a set of memory cells, showing a Vth downshift due to a word line voltage decay consistent with FIG. 14A to 14D, and showing a reduced Vth downshift when a word line voltage refresh operation is used consistent with the process of FIG. 13A. The vertical axis depicts a number of memory cells, on a logarithmic scale, and the horizontal axis depicts a Vth of the memory cells on a linear scale. In one approach, at a start of a program operation, the memory cells are all initially in the erased state as represented by the Vth distribution 1100. After the program operation is successfully completed, the memory cells assigned to the Er state are represented by the Vth distribution 1100a. The Vth distribution is upshifted due to program disturb. By minimizing a downshift in the Vth of the select gate transistors, the amount of program disturb can also be minimized.

The memory cells which are programmed to the A, B, C, D, E, F and G states using verify voltages of VvA, VvB, VvC, VvD, VvE, VvF and VvG, respectively, are represented by the Vth distributions 1101, 1102, 1103, 1104, 1105, 1106 and 1107, respectively. The Vth distributions are obtained just after completion of the program operation. The verify voltages are used in the program-verify tests of the memory cells. Read voltages VrA, VrB, VrC, VrD, VrE, VrF and VrG can be used for reading the states of the memory cells in a read operation. These verify voltages and read voltages are examples of control gate read levels of the selected word line voltage.

However, due to a decay of the data word line voltages, the Vth levels of the data memory cells can decrease as represented by Vth distributions 1101a, 1102a and 1103a for the A, B and C state memory cells, respectively. Generally, the decrease in the Vth levels is greatest for the lowest programmed data states. For simplicity, no downshift or change is depicted for the higher programmed data states, e.g., states D-G. If the Vth downshift is too great, read errors can result. By performing a refresh operation with a sufficient frequency, the Vth downshifts can be limited to the levels depicted by the Vth distributions 1101b, 1102b and 1103b for the A, B and C states, respectively. The refresh operation causes the Vth to increase to, or close to, the original levels represented by the Vth distributions 1101, 1102 and 1103 for the A, B and C states, respectively.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied to the word lines.

FIG. 12A depicts a voltage signal used in a series of program loops in an example program operation of a data memory cell which results in the Vth distributions 1100-1107 of FIG. 11. The horizontal axis denotes a program loop number, ranging from 1-22, and the vertical axis denotes voltage. During a program operation, program loops are performed for a selected word line in a selected block in each plane. A program loop comprises a program portion in which a program voltage or pulse is applied to the selected word line followed by a verify portion in which a verify signal is applied to the selected word line while one or more verify tests, referred to as program-verify tests, are performed for the associated memory cells. Other than the erased state, each assigned state has a verify voltage which is used in the verify test for the state in a program operation.

The voltage signal 1200 includes a series of program voltages, including an initial program voltage 1201, which are applied to a word line selected for programming. In this example, the voltage signal includes program voltages which increase stepwise in amplitude in one or more program loops of a programming pass using a fixed or varying step size. This is referred to as incremental step pulse programming, where the program voltage starts at an initial level Vpgm_int_mc (see program voltage 1201) and increases in a step in each successive program loop, for instance, until the program operation is completed. A successful completion occurs when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 1202, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification.

All memory cells may initially be in the erased state at the beginning of the program operation, for instance. After the program operation is completed, a Vth distribution similar to that in FIG. 11 is achieved, and the data can be read from the memory cells using read voltages which are between the Vth distributions. At the same time, a read pass voltage, Vpass (e.g., 8-10 V), also referred to as pass voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

FIG. 12B depicts a voltage signal used in a series of program loops in an example program operation of a select gate transistor which results in the Vth distribution (plot 1000) of FIG. 10A. As mentioned in connection with FIG. 10A, the select gate transistor may be programmed at the time of manufacture, and optionally at other subsequent times. The horizontal axis denotes a program loop number, ranging from 1-8, and the vertical axis denotes voltage. The programming of the select gate transistors is similar to the programming of the memory cells except typically a smaller initial program voltage, Vpgm_init_sgd (<Vpgm_int_mc), is used and the operation may be completed in fewer program loops. The voltage signal 1250 includes a series of program voltages, including an initial program voltage 1251, which are applied to a select gate line which is selected for programming. The verify signal in each program loop, including example verify signal 1252, includes a program-verify voltage VvSGD. Note that, in some cases, there are multiple SGD transistors in a NAND chain. In this case, the SGD transistors can be programmed separately. Moreover, a same or different verify voltage can be used in the programming of the different SGD transistors of the NAND chain.

The step size can be different for the programming of the select gate transistors compared to the programming of the memory cells.

FIG. 13A depicts a process for repeatedly refreshing data word line voltages without refreshing dummy word line voltages. Step 1300 involves powering on the memory device. Step 1301 includes performing a selective refresh of the word line voltages of a block. This can involve refreshing data word line voltages but not dummy word line voltages, or refreshing data word line voltages to a greater degree than a refreshing of dummy word line voltages. Step 1302 sets a timer. The timer can count for a period of time until a next refresh is performed, such as a few minutes. The timer may count up from zero to a time T, for example.

Subsequently, in one option, step 1303 is performed. Step 1303 includes performing a read or program operation for the block which couples up the word line voltages, before the timer expires. The read or program operation is performed in response to a command from the controller 122, for example. The coupling up which occurs as part of a program or read operation is described, e.g., in connection with FIG. 14A to 14D. Since the ramp down of the pass voltages which occurs in the program or read operation couples up the word line voltages in a similar way as the refresh operation, step 1302 is performed to set (reset) the timer to zero.

In another option, step 1304 is reached after step 1302. Step 1304 indicates that the timer has expired (the time period T has elapsed since the timer was set) before a program or read operation has been performed. For example, T=t3-t1 and t7-t5 in FIG. 15A. This indicates that a program or read operation (e.g., a storage operation) has not occurred during the time period, so that a next refresh operation should be performed. Other storage operations such as an erase operation also have not occurred. This time period can be considered to be an idle time of the selected block when no program, read or erase operation is being performed in the selected block. Step 1301 is then reached to perform another selective refresh of the word line voltages.

The process may be performed in parallel or sequentially for multiple blocks in the memory device.

Figure 13B:
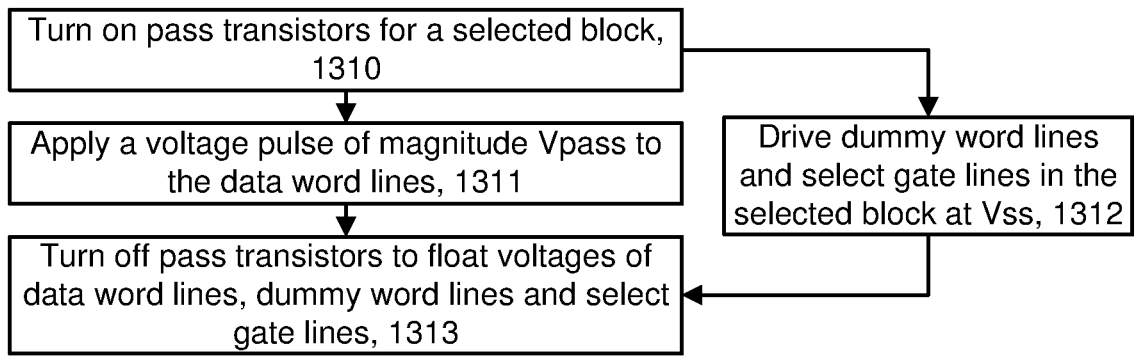
FIG. 13B depicts a process consistent with FIG. 13A, step 1301 for repeatedly refreshing data word line voltages without refreshing dummy word line voltages in a selected block.

FIG. 13B depicts a process consistent with FIG. 13A, step 1301 for repeatedly refreshing data word line voltages without refreshing dummy word line voltages in a selected block. Step 1310 includes turning on pass transistors for a selected block. For example, see FIG. 4, where the set 418 of pass transistors is associated with BLK_0. If the pass transistors are nMOS transistors, they can be turned on by applying a high voltage to the control gate on the control gate line 417. Step 1311 includes applying a voltage pulse of magnitude Vpass to the data word lines. See FIG. 15A and voltage pulses of plots 1500 and 1504 which are applied from t0-t1 and t4-t5, respectively. In one approach, a voltage output of a voltage driver is increased from 0 V to Vpass, held at Vpass and then decreased from Vpass to 0 V, while the pass transistors are turned on. The decrease of the word line voltage results in down coupling of the channel followed by up coupling of the word lines. For example, in FIG. 15A, the pass transistors can be turned on at or before t0 and then turned off at or after t1.

In another approach, a voltage driver outputs a steady voltage at Vpass while the pass transistors are turned off. The pass transistors are turned on and then off so that the word line only sees a voltage level of Vpass, but does not see the increase from 0 V to Vpass and the decrease from Vpass to 0 V. For example, in FIG. 15A, the pass transistors can be turned on and then off when the plot 1500 is at the peak level of Vpass_data. For example, the turn on can be after t0 and the turn off can be before t1. This approach can refresh the word line voltages by directly driving the word lines rather than through down coupling of the channel followed by up coupling of the word lines. This approach can be implemented by a voltage driver connected to a control gate of a data memory cell via a pass transistor, wherein a refresh circuit, to repeatedly increase the voltage of the control gate of the data memory cell, is configured to repeatedly control the voltage driver to output a positive voltage (Vpass) while the pass transistor is turned on, followed by turning off the pass transistor while the voltage driver outputs the positive voltage.

Step 1313 includes turning off the pass transistors to float the voltages of the data word lines, the dummy word lines and the select gate lines. If the pass transistors are nMOS transistors, they can be turned off by applying a low voltage to the control gate on the control gate line 417. The floating occurs from t1-t3 and t5-t7 in FIG. 15A for the data word lines, FIG. 15E for the dummy word lines and FIG. 15F for the SGD lines, for example.

Furthermore, during step 1311, step 1312 is performed to drive the dummy word lines and the select gate lines in the selected block at a low level such as Vss. For example, FIG. 15E at plots 1551 and 1554 shows the dummy word line voltage being driven at 0 V from t0-t1 and t4-t5, respectively, and FIG. 15F at plots 1561 and 1564 shows the SGD voltage being driven at 0 V from t0-t1 and t4-t5, respectively.

By driving the dummy word line voltages at a low level such as 0 V instead of applying a voltage pulse, a coupling up of the dummy word line voltages is avoided. Moreover, the dummy memory cells are in a non-conductive state so that the select gate line can also be driven with a low voltage and provided in a non-conductive state. Power is saved by avoiding a voltage pulse on the dummy word lines and select gate lines.

Generally, in a selected block, the drain side dummy word line voltages or the source side dummy word line voltages can be grounded, but not both the drain side and source side dummy word line voltages at the same time. For example, to avoid a Vth downshift in the SGD transistors, the SGS transistor and the source side dummy memory cells should be turned on to conduct Vss from the source line into the channel region associated with the data word lines. In this case, the SGS line voltage and the source side dummy word line voltage should be positive voltages. On the other hand, to avoid a Vth downshift in the SGS transistors, the SGD transistors and the drain side dummy memory cells should be turned on to conduct Vss from the bit line into the channel region associated with the data word lines. In this case, the SGD line voltage and the drain side dummy word line voltage should be positive voltages. In either case, the voltage can be grounded for both the source side and drain side dummy word lines in the unselected blocks, so that any coupled up voltage can be quickly discharged.

In one possible approach, the process alternates between grounding the source side and drain side dummy word line voltages in the selected block, in the successive refresh operations for a selected block. For instance, a first refresh operation may include grounding the source side dummy word line voltages but not the drain side dummy word line voltages in the selected block, a second refresh operation may include grounding the drain side dummy word line voltages but not the source side dummy word line voltages in the selected block, and so forth, as the process repeats. It is also possible to alternate between grounding of the drain side and source side dummy word line voltages, while giving priority to preventing a Vth downshift in the SGD or SGS transistors. For example, to give priority to preventing a Vth downshift in the SGD transistors while also preventing a Vth downshift in the SGS transistors, a process can include grounding the drain side dummy word line voltages but not the source side dummy word line voltages in a number N of successive refresh operations, then grounding the source side dummy word line voltages but not the drain side dummy word line voltages in a number M<N of successive refresh operations, then repeating the process. N and M are integers of one or more.

In one embodiment, an apparatus comprises: a selected block comprising memory cells, the memory cells arranged in NAND chains and connected to a set of word lines comprising data word lines and a dummy word line; means for applying a voltage pulse to the data word lines followed by floating of voltages of the data word lines, the applying of the voltage pulse followed by the floating of the voltages occurs repeatedly; and means for grounding a voltage of the dummy word line during the application of the voltage pulses. The set of word lines may further comprise a drain side dummy word line and a source side dummy word line, where the means for grounding alternates between grounding the drain side dummy word line and a source side dummy word line during the repeated application of the voltage pulse.

FIG. 13C depicts a process consistent with FIG. 13A, step 1301 for repeatedly refreshing data word line voltages without refreshing dummy word line voltages in related and unrelated blocks. Recall from FIG. 4 that related blocks may have their pass transistors connected and commonly controlled. Typically, one block at a time will be a selected block which is refreshed within the set of related blocks. Other blocks which are not in a particular set of blocks are unrelated blocks and do not have their pass transistors connected to the pass transistors in the particular set of blocks. For example, in FIG. 3, BLK_0 may be a selected block in which case BLK_1 to BLK3 are related blocks (since they have pass gates driven by the common control gate line 417) and BLK_4 to BLK_7 are unrelated blocks (since they have pass gates driven by a separate control gate line 412).

Step 1320 includes selecting a block to refresh. This selection may be based on a timer, power on event or other criteria as discussed in connection with FIG. 13A, Step 1321 includes turning on the commonly driven pass transistors for the selected block (e.g., BLK_0) and unselected blocks (e.g., BLK_1-BLK_3) in a set of related blocks. Step 1324 includes applying a voltage pulse of magnitude Vpass to the data word lines of the selected block. Step 1325 includes turning off the pass transistors to float the voltages of the data word lines, dummy word lines and select gate lines in the set of related blocks. A decision step 1326 determines whether there is a next bock to refresh. If the decision step is true, step 1320 is reached to select the next block to refresh. If the decision step is false, the process is done at step 1327.

During step 1324, steps 1322 and 1323 can be performed. Step 1322 includes driving the dummy word lines and the select gate lines of the set of related blocks at a low level such as Vss, e.g., 0 V, and driving the drive data word lines of the unselected blocks of the set of related blocks at an intermediate, positive level, Vint, e.g., 4-5 V, where Vint<Vpass. In one approach, Vint is greater than Vdd, e.g., 2.5 V, the power supply voltage of the chip. Vint can be set based on the peak coupled up level of the word line voltage, Vwl_coupled_up (FIG. 15A). Thus, in one approach, a higher pass voltage (Vpass), e.g., 8-10 V is applied to the data word lines, a low voltage such as 0 V is applied to the dummy word lines and select gate lines, and an intermediate voltage is applied to the data word lines of the unselected blocks of the set of related blocks. Step 1323 includes turning off the pass transistors to float the voltages of the data word lines, dummy word lines and select gate lines in unrelated, unselected blocks (e.g., BLK_4-BLK_7).

Figure 13D:
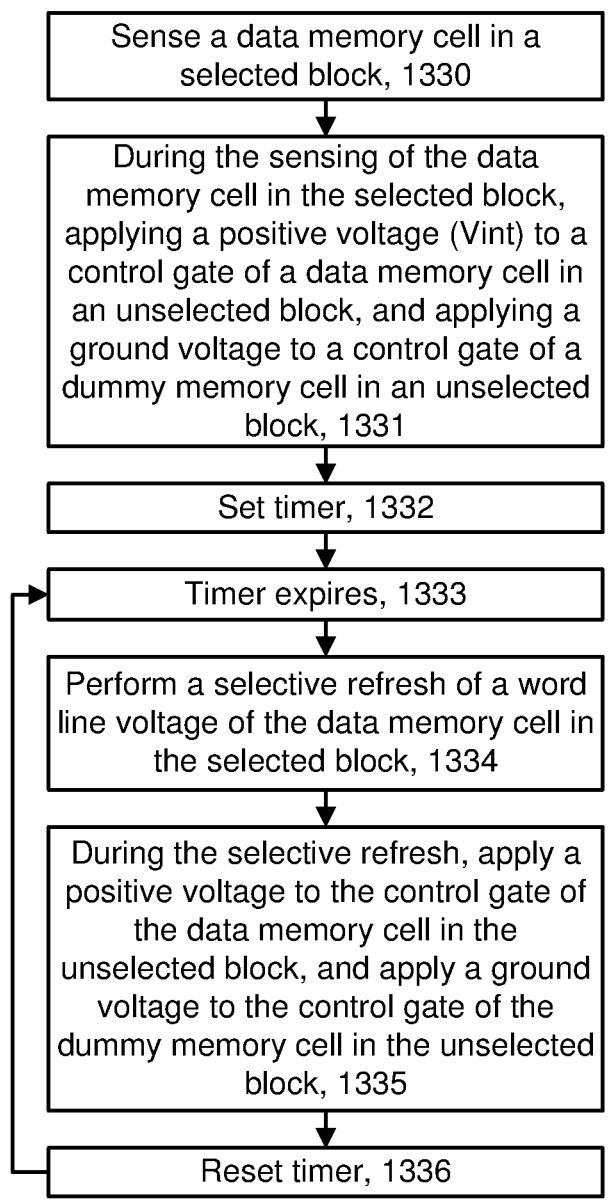
FIG. 13D depicts a process for repeatedly refreshing data word line voltages without refreshing dummy word line voltages, after a sensing operation.

FIG. 13D depicts a process for repeatedly refreshing data word line voltages without refreshing dummy word line voltages, after a sensing operation. The process is similar to that of FIG. 14A but begins with a sensing operation rather than a selective refresh. Step 1330 includes sensing a data memory cell in a selected block, such as in a program-verify test or a read operation. Step 1331 includes, during the sensing of the data memory cell in the selected block, applying a positive voltage (e.g., Vint) to a control gate of a data memory cell in an unselected block (see plots 1570 and 1573 in FIG. 15G), and applying a ground voltage to a control gate of a dummy memory cell in an unselected block (see plots 1551 and 1554 in FIG. 15G). Step 1332 includes setting a timer. Step 1333 indicates that the timer expires. At this time, steps 1134 and 1335 are performed concurrently. Step 1334 includes performing a selective refresh of a word line voltage of the data memory cell in the selected block, such as discussed in connection with step 1301 of FIG. 13A. Step 1335 includes, during the selective refresh, applying a positive voltage (e.g., Vint) to the control gate of the data memory cell in the unselected block, and applying a ground voltage to the control gate of the dummy memory cell in the unselected block, similar to step 1331. Step 1336 includes resetting the timer. Step 1333 is reached again when the timer expires.

This approach provides the advantage of maintaining a data word line voltage in an unselected block at a coupled up level, or other elevated level, while maintaining a dummy word line voltage in the unselected block at a ground or other low level. This occurs during both a sensing operation in a selected block and repeatedly thereafter during a refresh operation in the selected block, upon expiration of a timer. This approach is suitable particularly when the unselected block is related to the selected block by having commonly driven pass transistors.

FIG. 14A depicts a plot of example waveforms in a programming operation, showing coupling up of a word line voltage, where the coupling up of a dummy word line voltage can cause the hole migration of FIG. 9B. As mentioned, e.g., in connection with FIG. 9B, the control gate or word line voltage of the memory cells can be floated to a level such as 5 V after a program, read or erase operation. This results in an electric field which causes holes to move toward the SGD transistors and cause charge loss. FIGS. 14A and 14B describe the floating which occurs after a program operation and FIGS. 14C and 14D describe the floating which occurs after a read operation.

The time period shown represents one program-verify iteration or loop. The horizontal axis depicts time and the vertical axis depicts word line voltage, Vwl. A program voltage 1400 is applied to a selected word line from t0-t4 and reaches a magnitude of Vpgm. The program voltage can temporarily pause at an intermediate level such as Vpass to avoid a single large transition which can have undesired coupling effects. A pass voltage 1405 is applied to the unselected word lines from t0-t19 and reaches a magnitude of Vpass, which is sufficiently high to provide the memory cells in a conductive state so that the sensing (e.g., verify) operations can occur for the memory cells of the selected word line. The pass voltage includes an increasing portion, a fixed amplitude portion, for instance, at Vpass and a decreasing portion. Optionally, the pass voltage may be increased sooner relative to the program voltage so that Vpass is reached by to.

A verify voltage 1410 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The sense circuits may be activated during each verify voltage. The waveform decreases from VvG, or from a voltage slightly higher than VvG, to 0 V or other steady state level from t15-t16.

For the unselected word lines, the decrease in Vpass will cause the memory cells to transition from a conductive state to a non-conductive state. In particular, when the Vpass falls below a cutoff level, Vcutoff (the dotted line at t18), the channel of the memory cell will become cutoff, e.g., the memory cell will become non-conductive. When a cell becomes non-conductive, it acts as a capacitor in which the control gate is one plate and the channel is another plate. A cell becomes non-conductive when Vcg<Vcutoff or Vcg< (Vth+Vsl), where Vcg is the control gate voltage of the memory cell (the word line voltage), Vth is the threshold voltage of the memory cell and Vsl is the source line voltage which in turn is approximately the voltage at the source terminal of the memory cell. For a cell in the highest programmed state, e.g., the G state, the Vth can be as low as VvG (or lower due to post-programming charge loss) and as high as the Vth at the upper tail of the G state in the Vth distribution 1207 in FIG. 12. Vcutoff can therefore be as low as VvG+Vsl or as high as Vth of G state upper tail+Vsl. As the pass voltage 1405 decreases from Vcutoff to 0 V, the channel is capacitively coupled down by a similar amount, as represented by plot 1415 in FIG. 14B.

The voltage swing while the channel is cutoff will be larger when Vsl is larger. However, since Vch=Vsl, the minimum downcoupled level of Vch will be essentially independent of Vsl. For example, a 6 V swing in the word line voltage (e.g., Vcutoff=6 V) with Vsl=1 V will result in about the same minimum downcoupled level of Vch as a 5 V swing in the word line voltage (e.g., Vcutoff=5 V) with Vsl=0 V.

The plot 1412 represents the coupling up of the word line voltages from t19-t20. The coupling up is depicted as occurring relatively quickly but this is not to scale. In practice, the verify operation, e.g., from t5-t19, may consume about 100 microseconds, while the coupling up of the word line may be significantly longer, in the millisecond range such as 10 milliseconds.

FIG. 14B depicts a plot of a channel voltage (Vch) corresponding to FIG. 14A. For an unselected NAND chain (a string not having a cell which is programmed in the current program loop), Vch will be boosted to a level such as 8 V (not shown) during the program voltage, e.g., from t0-t4. Specifically, Vch is coupled higher due to capacitive coupling from the word lines, when the voltages of the word lines are ramped up from 0 V to Vpass or Vpgm. The coupling is facilitated by allowing Vch to float. Vch can float when the ends of the NAND chain are cutoff, so that the channel is disconnected from the source line and bit line. The ends of the NAND chain, in turn, are cutoff when the control gate voltages of the SGD and SGS transistors of the unselected NAND chain are set to a low level (less than the Vth of the SGD and SGS transistors) which results in the SGD and SGS transistors being in a non-conductive state. For a selected NAND chain (a NAND chain having a cell which is programmed in the current program loop), Vch is typically grounded as shown during the program voltage. Vch can be grounded by grounding the bit line, and setting a control gate voltage of the SGD transistor to a high level (above the Vth of the SGD transistor) such that the SGD transistor is in a conductive state, which allows the channel to communicate with the bit line.

During the verify voltages, Vch may be initially at about 1 V, for instance, for a selected NAND chain. Vch is about the same as Vsl for the channels of the selected NAND chains. Vsl is set based on a type of sensing which is used. Examples include negative sensing in which Vsl is about 1 V and positive sensing in which Vsl is about 0 V and a negative word line voltage is used. The techniques described herein apply regardless of the level of Vsl or the type of sensing used.

The channel is capacitively coupled down to a minimum level from t18-t19 and then begins to return to a final level of, e.g., 0 V from t19-t20. If the voltages of the word lines are allowed to float starting at t19, the voltages (plot 1412) are capacitively coupled higher by the increase in Vch. The voltages of the word lines float to a peak level of Vwl_coupled_up, e.g., about 5 V, thereby reaching the second read condition. For example, Vcutoff may be 6 V, so that there is a 6 V change in the word line voltage, e.g., 6-0 V, which is coupled to the channel. With the initial value of Vch at 1 V and a 90% coupling ratio, the minimum Vch may be about 1−6×0.9=−4.4 V, for instance. Accordingly, there is a 4.4 V increase in Vch which is coupled to the word line, e.g., control gate, of the memory cells. Vwl_coupled_up may be about 4.4×0.9=4 V. The voltages of the word lines are floated by disconnected the word lines from a word line driver.

FIG. 14C depicts a plot of example waveforms in a read operation, showing coupling up of a word line voltage, where the coupling up of a dummy word line voltage can cause the hole migration of FIG. 9B. A read operation is similar to a verify operation as both are sensing operations and both can provide a coupling up of the word line voltages. The horizontal axis depicts time and the vertical axis depicts word line voltage, Vwl. Pass voltages 1430, 1431 and 1432 are applied to the unselected word lines from t0-t3, t4-t8 and t9-t12, respectively, and have a magnitude of Vpass. The pass voltage includes an increasing portion, a portion at Vpass and a decreasing portion. A read voltage includes separate waveforms 1420 (at levels of VrA and VrE), 1421 (at levels of VrB, VrD and VrF) and 1422 (at levels of VrC and VrG) for each of the lower, middle and upper pages, respectively, consistent with FIG. 12. The read voltages are optimized for the second read condition, as an example, and are applied to the selected word line. An eight-level memory device is used in this example.

For the unselected word lines, the decrease in Vpass will cause the memory cells to transition from a conductive state to a non-conductive state, as discussed. The dotted line at t13 indicates when a G state cell becomes non-conductive. As the pass voltage 1432 decreases from Vcutoff to 0 V, the channel is capacitively coupled down by a similar amount, as represented by the plot 1435 in FIG. 14D. As the channel voltage increases after t14, the word line voltages are floated and are coupled higher, to Vwl_coupled_up.

Coupling up can also occur after an erase operation. At the end of the erase-verify operation, both Vsgd and Vsgs ramp down and cut off the channel when their control gate voltage falls below their Vth, e.g., 2 V (or higher in some cases). When the select gate voltage continues to decrease to 0 V, the channel potential, especially under the SGD transistor and the DD0 dummy memory cell, is down coupled due to gate-to-channel coupling. This is an unstable situation since Vbl=0 V, so that electron-hole pairs are generated in the channel. The channel potential returns to about 0 V, causing coupling up of the control gate of the dummy memory cell to about 2 V. The down coupling and associated coupling up is greater when the Vth of the select gate transistor is higher.

FIG. 14D depicts a plot of a channel voltage (Vch) corresponding to FIG. 14C. The channel is capacitively coupled down to a minimum level of Vch min from t13-t14 and then begins to return to a final level of, e.g., 0 V from t14-t15. If the voltages of the word lines are allowed to float starting at t14, the voltages (plot 1432) are capacitively coupled higher by the increase in Vch (plot 1435). The voltages of the word lines float to a peak level of Vwl_coupled_up, as discussed.

FIG. 15A depicts a plot of data word line voltages (Vwl_data) in a process consistent with FIG. 13A for refreshing data word line voltages. In FIG. 15A-15G, the horizontal axes indicates a common time scale and the vertical axes indicate a voltage. The time period depicted represents two refresh operations, as an example. Typically, many successive refresh operations can occur. A first refresh operation occurs starting at t0, when a voltage pulse (plot 1500) of magnitude Vpass_data, e.g., 8-10 V, is applied to the data word lines. When the voltage pulse ramps down at t1, the associated channel voltage (Vch) represented by plot 1510 in FIG. 15B also decreases, e.g., Vch is down coupled. As Vch recovers and increases from t1-t2, Vwl_data is coupled up to Vwl_coupled_up, e.g., about 4-5 V. Vwl_coupled_up represents the peak coupled up level of the data word lines. The data word lines are disconnected from the associated voltage drivers at t1 by turning off the pass transistors. This causes the data word line voltages to float from t1-t3 at which time the data word lines are coupled up by the channel and subsequently experience a voltage decay to Vwl_coupled_min (plot 1502).

The timer is also started at t1. When the timer expires at t3, a next refresh operation begins. The time period t3-t4 allows the word line voltages to be reset to 0 V before the voltage pulse (plot 1504) is applied from t4-t5. A second refresh operation occurs starting at t4, when a voltage pulse (plot 1504) of magnitude Vpass_data is applied to the data word lines. When the voltage pulse ramps down at t5, Vch, represented by plot 1512 in FIG. 15B also decreases. As Vch recovers and increases from t5-t6, Vwl_data is again coupled up to Vwl_coupled_up. The data word lines are disconnected from the associated voltage drivers at t5 to cause the data word line voltages to float from t5-t7 at which time the data word lines are coupled up by the channel and subsequently experience a voltage decay to Vwl_coupled_min (plot 1506). The time for repeating the refresh operation can be set based on the amount of word line voltage decay which is acceptable as well as other factors such as the number of P-E cycles, as discussed.

A block is considered to be in a first read condition when the word line voltages have decayed to, or close to, 0 V. This condition is typically not desired because the Vth distributions may downshift from the levels which were achieved just after programming, as depicted in FIG. 11, potentially resulting in read errors. A block is considered to be in a second read condition when the word line voltages are between the peak coupled up level of Vwl_coupled_up and the minimum decayed level of Vwl_coupled_min. This condition is desirable because the Vth distributions are close to the levels which were achieved just after programming.

FIG. 15B depicts a plot showing a channel voltage (Vch) associated with a data memory cell, consistent with FIG. 15A. Vch may be about 0 V nominally and periodically down coupled to a negative voltage such as −4 V when the word line voltage from a voltage pulse is ramped down. The down coupling occurs in a portion of the channel which is adjacent to a word line when that word line's voltage is ramped down. If all of the data word line voltages are ramped down together, the down coupling will occur in a continuous portion of the channel.

FIG. 15C depicts a plot of a Vth of a data memory cell (MC), consistent with FIGS. 15A and 15B. As mentioned in connection with FIG. 11, a refresh operation can help stabilize the Vth of a data memory cell and reduce a Vth downshift. The Vth is depicted for an example memory cell and is initially at a level referred to as Vth_initial_data. For example, for an A state memory cell, Vth_initial_data may be within the Vth distributions 1101 or 1101b in FIG. 11. Memory cells in different data states will have a different Vth. When the word line is coupled up, the Vth of the memory cell will be stabilized. A small upshift in the Vth may occur when the word line voltage is coupled up (e.g., from t1-t2 and t5-t6) followed by a small downshift in the Vth as the word line voltage decays (e.g., from t2-t3 and t6-t7). The Vth may be coupled up to a level referred to as Vth_coupled_up and decay to a level referred to as Vth_decayed (plots 1520 and 1522). This cycle of up-coupling and decay can be repeated continuously. The refresh operation maintains the Vth of the memory cell in a relatively small range so that the memory cell can be accurately read.

FIG. 15D depicts a plot of a Vth of a dummy memory cell, consistent with FIG. 15E, plots 1551 and 1554. By grounding the dummy word lines, such as depicted by plot 1551 and 1554 in FIG. 15E, or otherwise keeping them at a low level compared to Vpass during the application of the voltage pulse to the data word lines, a coupling up of the dummy word lines can be avoided. Grounding the dummy word lines involves driving the dummy word lines at 0 V using the voltage drivers 449-449c in FIG. 3, for example. The control gates of the dummy memory cells are therefore also driven at 0 V. Recall from FIG. 4 that all pass transistors in a block may be in a common conductive state so that the voltage drivers are connected to the word lines and control gate lines. The pass transistors 418b and 418c, for example, which are connected to the dummy word lines WLDD1 and WLDD0, respectively, in BLK_0 may be in a conductive state. A grounding voltage can be routed from the voltage drivers 449-449c to these dummy word lines by the row decoder 124.

Grounding the dummy word lines avoids creating an electric field which encourages the movement of holes from the dummy memory cell to the adjacent select gate transistor, as mentioned previously. In particular, the ramp down of the word lines voltages such as depicted by plot 1405 in FIG. 14A and plot 1432 in FIG. 14C does not occur on the dummy word lines. Since the dummy word line voltage does not undergo the cycles of coupling up and decay, the Vth of the dummy memory cells is also stable as depicted by the dashed line. It is possible that the Vth of the dummy memory cells downshifts are they are programmed. However, since they do not store user data, some downshift of their Vth is acceptable.

FIG. 15E depicts a plot of dummy word line voltages (Vdummy), including an option to prevent refreshing of the dummy word line voltages (plots 1551 and 1554), consistent with the process of FIG. 13A, and an option to refresh dummy word line voltages (plots 1550 and 1553), as a comparative example. During the application of the voltage pulse to the data word lines (FIG. 15A), the dummy word line voltages can be kept at a low level as depicted by plots 1551 and 1554. The dummy word line voltages are floated from t1-t4 and t5-t7.

As a comparative example, plots 1550 and 1553 depict voltage pulses which could be applied to the dummy word lines.

FIG. 15F depicts a plot of select gate line voltages, including an option to provide select gate transistors in a non-conductive state (plots 1561 and 1564), consistent with the process of FIG. 13B, and an option to provide select gate transistors in a conductive state (plots 1560 and 1563). During the application of the voltage pulse to the data word lines (FIG. 15A), the select gate line voltages can be kept at a low level as depicted by plots 1561 and 1564. The select gate line voltages are floated from t1-t4 and t5-t7.

As a comparative example, plots 1560 and 1563 depict voltage pulses which could be applied to the select gate lines.

FIG. 15G depicts a plot showing data word line voltages (Vwl_data_unsel) for an unselected block in a set of related blocks, consistent with the process of FIG. 13C and with the circuit of FIG. 4. As mentioned in connection with FIG. 13C, and referring also to FIG. 4, data word line voltages can be provided at an intermediate level, Vint, in an unselected, related block during the application of the voltage pulse at Vpass to the data word lines in the selected block. Plots 1570 and 1573 show Vint as the data word line voltage from t0-t1 and t4-t5, respectively, for the unselected blocks in the set of related blocks. Plots 1571 and 1574 show 0 V as the data word line voltage from t0-t1 and t4-t5, respectively, for unselected blocks in an unrelated set of blocks.

For example, in the set 410 of blocks, when BLK_0 is the selected block, the intermediate voltage of plots 1570 and 1573 is applied to the data word lines in the unselected blocks BLK_1, BLK_2 and BLK_3 in the set of related blocks. The grounding voltage of plots 1571 and 1574 is applied to the data word lines in the unselected blocks BLK_4, BLK_5, BLK_6 and BLK_7 in the unrelated set 411 of blocks (FIG. 3).

In one implementation, an apparatus comprises: a set of connected memory cells comprising a data memory cell adjacent to one or more dummy memory cells, the data memory cell comprising a control gate and the one or more dummy memory cells comprising a dummy memory cell positioned adjacent to a select gate transistor; and a refresh circuit configured to repeatedly increase a voltage at the control gate to keep the voltage at the control gate higher than a voltage of a control gate of the dummy memory cell positioned adjacent to the select gate transistor.

In another implementation, a method comprises: sensing a data memory cell in a set of connected memory cells, the set of connected memory cells also comprising a dummy memory cell, the dummy memory cell positioned adjacent to a select gate transistor; upon completion of the sensing, setting a timer; and upon expiration of the timer, boosting a voltage of a control gate of the data memory cell while preventing boosting of a voltage of a control gate of the dummy memory cell. The sensing of the data memory cell can include performing a program-verify test for the data memory cell such as in FIG. 14A and reading the data memory cell such as in FIG. 15A.

In another implementation, such as in FIG. 13D, a method comprises: sensing a data memory cell in a set of connected memory cells in a selected block of a memory device, the set of connected memory cells also comprising a dummy memory cell, the dummy memory cell positioned adjacent to a select gate transistor, wherein the memory device also comprises a set of connected memory cells in an unselected block, the set of connected memory cells in the unselected block comprising a data memory cell and a dummy memory cell, the dummy memory cell in the unselected block is adjacent to a select gate transistor in the unselected block; and during the sensing of the data memory cell in the selected block, applying a positive voltage to a control gate of the data memory cell in the unselected block, the positive voltage is less than a magnitude of the voltage pulse, and applying a ground voltage to a control gate of the dummy memory cell in the unselected block.

The method may further comprise: upon completion of the sensing, setting a timer; and upon expiration of the timer, concurrently boosting a voltage of a control gate of the data memory cell in the selected block, preventing boosting of a voltage of the control gate of the dummy memory cell in the selected block, applying the positive voltage to the control gate of the data memory cell in the unselected block, and applying the ground voltage to the control gate of the dummy memory cell in the unselected block. The concurrently boosting the voltage of the control gate of the data memory cell in the selected block, and the preventing boosting of the voltage of the control gate of the dummy memory cell in the selected block, involves a select refresh of the word line or control gate voltage of the data memory cell in the selected block.

The means for repeatedly applying a voltage pulse may include the power control module 116 of FIG. 1A, including the data word line drivers 447 and 448, the row decoder 124 and the pass transistors 422 of FIG. 4, or other logic hardware, and/or other executable code stored on a computer readable storage medium or device. Other embodiments may include similar or equivalent means.

The means for repeatedly applying the voltage pulse may comprise means for connecting a voltage driver to the data word lines (e.g., data word line voltage driver 447 and 448 in FIG. 3), increasing an output voltage of the voltage driver to a peak level (e.g., Vpass_data in FIG. 15A), decreasing the output voltage of the voltage driver from the peak level to a final level (e.g., 0 V), and disconnecting the voltage driver from the data word lines.

The means for grounding a voltage may include the power control module 116 of FIG. 1A, including the dummy word line drivers 449-449c, the row decoder 124 and the pass transistors 422 of FIG. 4, the or other logic hardware, and/or other executable code stored on a computer readable storage medium or device. Other embodiments may include similar or equivalent means.

In another implementation, an apparatus comprises a plurality of NAND chains arranged in a selected block, each NAND chain comprising data memory cells connected to data word lines, a dummy memory cell connected to a dummy word line, and a select gate transistor adjacent to the dummy memory cell, wherein voltages of the data word lines and a voltage of the dummy word line decay when no storage operation is being performed in the selected block; a trigger circuit configured to determine that a condition is met to refresh the voltages of the data word lines; and maintenance circuitry configured to refresh the voltages of the data word lines, the maintenance circuitry configured to allow a greater amount of the voltage decay of the dummy word line compared to an amount of voltage decay of the data word lines.

In another implementation, a system comprises: a controller; and a memory die connected to the controller. The memory die comprises: a set of connected memory cells comprising a data memory cell and a dummy memory cell; and a select gate transistor adjacent to the dummy memory cell, the controller configured to repeatedly increase a voltage of a control gate of the data memory cell while grounding a control gate of the dummy memory cell.

The foregoing detailed description of the invention has been presented for purposes of illustration and description.

It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:
1. An apparatus, comprising:
  a set of connected memory cells comprising a data memory cell adjacent to one or more dummy memory cells, the data memory cell comprising a control gate and the one or more dummy memory cells comprising a dummy memory cell positioned adjacent to a select gate transistor; and
  a refresh circuit configured to repeatedly increase a voltage at the control gate to keep the voltage at the control gate higher than a voltage of a control gate of the dummy memory cell positioned adjacent to the select gate transistor.

2. The apparatus of claim 1, wherein:
  the refresh circuit is configured to increase the voltage of the control gate of the data memory cell in response to expiration of a timer.

3. The apparatus of claim 2, wherein:
  the set of connected memory cells is in a block; and
  a period of the timer is a decreasing function of a number of program-erase cycles of the block.

4. The apparatus of claim 1, wherein:
  the refresh circuit, to repeatedly increase the voltage of the control gate of the data memory cell, is configured to repeatedly apply a voltage pulse to the control gate of the data memory cell followed by floating the voltage of the control gate of the data memory cell; and
  the refresh circuit is configured to float the voltage of the control gate of the dummy memory cell positioned adjacent to the select gate transistor during the floating of the voltage of the control gate of the data memory cell.

5. The apparatus of claim 4, wherein:
  the refresh circuit is configured to ground the voltage of the control gate of the dummy memory cell positioned adjacent to the select gate transistor during the application of the voltage pulse to the control gate of the data memory cell.

6. The apparatus of claim 4, wherein:
  the refresh circuit is configured to set the voltage of the control gate of the dummy memory cell positioned adjacent to the select gate transistor at a level which is below a level of the voltage pulse which is applied to the control gate of the data memory cell, during the application of the voltage pulse to the control gate of the data memory cell.

7. The apparatus of claim 1, further comprising:
  a voltage driver connected to a control gate of the data memory cell via a pass transistor, wherein the refresh circuit, to repeatedly increase the voltage of the control gate of the data memory cell, is configured to repeatedly control the voltage driver to output a positive voltage while the pass transistor is turned on, followed by turning off the pass transistor while the voltage driver outputs the positive voltage.

8. The apparatus of claim 1, wherein:
the repeated increase of the voltage of the control gate of the data memory cell occurs without a repeated increase of the voltage of the control gate of the dummy memory cell positioned adjacent to the select gate transistor.

9. The apparatus of claim 4, wherein the set of connected memory cells is in a selected block, further comprising:
a set of connected memory cells in an unselected block, the set of connected memory cells in the unselected block comprising a data memory cell, a dummy memory cell and a select gate transistor adjacent to the dummy memory cell in the unselected block; and
a voltage driver configured to apply a positive voltage to a control gate of the data memory cell in the unselected block, the positive voltage is less than a magnitude of the voltage pulse, and a ground voltage to a control gate of the dummy memory cell in the unselected block, when the refresh circuit applies the voltage pulse to the control gate of the data memory cell in the selected block.

10. The apparatus of claim 9, further comprising:
a first set of pass transistors connected to the control gate of the data memory cell in the selected block and the control gate of the dummy memory cell positioned adjacent to the select gate transistor in the selected block; and
a second set of pass transistors connected to the control gate of the data memory cell in the unselected block and the control gate of the dummy memory cell in the unselected block, wherein control gates of the first set of pass transistors are connected to control gates of the second set of pass transistors.

11. The apparatus of claim 1, wherein:
the set of connected memory cells is in a selected block; and
the refresh circuit is configured to repeatedly increase the voltage of the control gate of the data memory cell during an idle time of the selected block when no program, read or erase operation is being performed in the selected block.

12. A method, comprising:
sensing a data memory cell in a set of connected memory cells in a selected block of a memory device, the set of connected memory cells also comprising a dummy memory cell, the dummy memory cell positioned adjacent to a select gate transistor, the memory device also comprising a set of connected memory cells in an unselected block, the set of connected memory cells in the unselected block comprising a data memory cell and a dummy memory cell, the dummy memory cell in the unselected block positioned adjacent to a select gate transistor in the unselected block; and
during the sensing of the data memory cell in the selected block, applying a positive voltage to a control gate of the data memory cell in the unselected block, and applying a ground voltage to a control gate of the dummy memory cell in the unselected block.

13. The method of claim 12, further comprising:
upon completion of the sensing, setting a timer; and
upon expiration of the timer, concurrently boosting a voltage of a control gate of the data memory cell in the selected block, applying the ground voltage to a control gate of the dummy memory cell in the selected block, applying the positive voltage to the control gate of the data memory cell in the unselected block, and applying the ground voltage to the control gate of the dummy memory cell in the unselected block.

14. The method of claim 13, wherein:
the boosting the voltage of the control gate of the data memory cell in the selected block comprises applying a voltage pulse to the control gate of the data memory cell in the selected block followed by floating the voltage of the control gate of the data memory cell in the selected block; and
the voltage of the control gate of the dummy memory cell in the selected block and the voltage of the control gate of the dummy memory cell in the unselected block are floated during the floating of the voltage of the control gate of the data memory cell in the selected block.

15. An apparatus, comprising:
a selected block comprising memory cells, the memory cells arranged in NAND strings and connected to a set of word lines comprising data word lines and a dummy word line;
means for applying a voltage pulse to the data word lines followed by floating of voltages of the data word lines, the applying of the voltage pulse followed by the floating of the voltages occurs repeatedly; and
means for grounding a voltage of the dummy word line during the application of the voltage pulses.

16. The apparatus of claim 15, further comprising:
an unselected block comprising memory cells, the memory cells are arranged in NAND strings and connected to a set of word lines comprising data word lines and a dummy word line;
means for applying a positive voltage to the data word lines of the unselected block during the applying the voltage pulse to the data word lines of the selected block; and
means for grounding a voltage of the dummy word line of the unselected block during the applying the voltage pulse to the data word lines of the selected block.

17. The apparatus of claim 15, wherein:
the set of word lines comprises a drain side dummy word line and a source side dummy word line; and
the means for grounding alternates between grounding the drain side dummy word line and a source side dummy word line during successive applications of the voltage pulse.

18. An apparatus, comprising:
a plurality of NAND strings arranged in a selected block, each NAND string comprising data memory cells connected to data word lines, a dummy memory cell connected to a dummy word line, and a select gate transistor adjacent to the dummy memory cell, wherein voltages of the data word lines and a voltage of the dummy word line decay when no storage operation is being performed in the selected block;
a trigger circuit configured to determine that a condition is met to refresh the voltages of the data word lines; and
maintenance circuitry, the maintenance circuitry, to refresh the voltages of the data word lines, is configured to apply a voltage pulse to the data word lines while grounding the dummy word line, then float the voltage of the data word lines while floating the voltage of the dummy word line.

19. The apparatus of claim 18, wherein:
the maintenance circuitry is configured to repeatedly apply a voltage pulse to the data word lines while grounding the dummy word line.

20. A system, comprising:
a controller; and
a memory die connected to the controller, the memory die comprises:
  a set of connected memory cells comprising a data memory cell and a dummy memory cell; and
  a select gate transistor adjacent to the dummy memory cell, the controller configured to repeatedly increase a voltage of a control gate of the data memory cell while grounding a control gate of the dummy memory cell.

21. The method of claim 12, wherein:
the positive voltage is greater than a power supply voltage of the memory device and less than a pass voltage.

22. The apparatus of claim 16, wherein:
the positive voltage is greater than a power supply voltage and less than the voltage pulse.

* * * * *